(12) United States Patent
Lee et al.

(10) Patent No.: US 7,755,527 B2
(45) Date of Patent: **\*Jul. 13, 2010**

(54) READ AND WRITE INTERFACE COMMUNICATIONS PROTOCOL FOR DIGITAL-TO-ANALOG SIGNAL CONVERTER WITH NON-VOLATILE MEMORY

(75) Inventors: Thomas Youbok Lee, Chandler, AZ (US); Yann Johner, Preverenges (CH); Philippe Gimmel, Lausanne (CH); Tim Sherman, Phoenix, AZ (US); Jonathan Jackson, Gilbert, AZ (US); John Austin, Queen Creek, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 19 days.

This patent is subject to a terminal disclaimer.

(21) Appl. No.: 12/336,726

(22) Filed: Dec. 17, 2008

(65) Prior Publication Data
US 2009/0179785 A1      Jul. 16, 2009

Related U.S. Application Data

(63) Continuation-in-part of application No. 12/017,582, filed on Jan. 22, 2008, now Pat. No. 7,589,652.

(60) Provisional application No. 61/021,448, filed on Jan. 16, 2008.

(51) Int. Cl.
  *H03M 1/66* (2006.01)
(52) U.S. Cl. .................................... 341/144; 341/141
(58) Field of Classification Search .............. 341/141, 341/144
See application file for complete search history.

(56) References Cited

U.S. PATENT DOCUMENTS

| | | | | |
|---|---|---|---|---|
| 6,466,149 | B2 * | 10/2002 | Tabler | 341/144 |
| 6,765,954 | B1 | 7/2004 | Eichrodt et al. | |
| 6,823,416 | B1 * | 11/2004 | Dempsey et al. | 710/305 |
| 6,985,100 | B2 * | 1/2006 | Geraghty et al. | 341/141 |

OTHER PUBLICATIONS

International Search Report, PCT/US2009/030960, 15 pages, Aug. 11, 2009.
International Search Report and Written Opinion, mailed Oct. 9, 2008, for international patent application No. PCT/US2008/059918.
Intersil Americas Inc., NV DAC with Selectable Output Range and Memory, Mar. 17, 2005, pp. 1-18, XP002497504; retrieved from Internet address http://www.intersil.com/data/fn/fn8147.pdf.

(Continued)

*Primary Examiner*—Khai M Nguyen
(74) *Attorney, Agent, or Firm*—King & Spalding L.L.P.

(57) ABSTRACT

A mixed signal integrated circuit device, e.g., digital-to-analog converter (DAC), has a serial interface communication protocol that accesses volatile and/or non-volatile memory and allows a preprogrammed output voltage whenever the mixed signal device is powered-up. However, unlike conventional DACs, DACs with non-volatile memory may need special interface communication protocols for effective operation of the DAC and communications between a system master controller unit (MCU). Interface communications protocols that do not violate standard serial bus communications protocols are provided for communicating between the volatile and non-volatile memories of the DAC so that the MCU may access the DAC's memories (non-volatile and/or volatile memories). The mixed signal integrated circuit device has a user programmable address.

34 Claims, 17 Drawing Sheets

OTHER PUBLICATIONS

Analog Devices: Dual Low Power CMOS Analog Front End with DSP Microcomputer, Mar. 2006, pp. 1-32, XP002497505, retrieved from Internet address http://www.analog.com.

Deno, S. et al.: A Low Cost Microcontroller Compensated Crystal Oscillator: IEEE International Frequency Control Symposium, 1997, pp. 954-960; XP002497506.

* cited by examiner

FIGURE 16    Repeat for each DAC Channel

READ AND WRITE INTERFACE COMMUNICATIONS PROTOCOL FOR DIGITAL-TO-ANALOG SIGNAL CONVERTER WITH NON-VOLATILE MEMORY

RELATED PATENT APPLICATIONS

This application is a continuation-in-part and claims priority to commonly owned U.S. patent application Ser. No. 12/017,582, now U.S. Pat. No. 7,589,652 filed Jan. 22, 2008; entitled "Read and Write Interface Communications Protocol for Digital-to-Analog Signal Converter with Non-Volatile Memory," by Thomas Youbok Lee, Jonathan Jackson, John Austin, Andrew Swaneck and Yann Johner; and claims priority to commonly owned U.S. Provisional Patent Application Ser. No. 61/021,448; filed Jan. 16, 2008; entitled "Read and Write Interface Communications Protocol for Digital-to-Analog Signal Converter with Non-Volatile Memory," by Thomas Youbok Lee, Yann Johner, Philippe Gimmel, Tim Sherman, Jonathan Jackson and John Austin; both are hereby incorporated by reference herein for all purposes.

TECHNICAL FIELD

The present disclosure relates to digital-to-analog converters (DACs) that store configuration and address information, and input data in non-volatile memory; and more particularly to, multi-channel DACs having non-volatile memory and using serial communication protocols over conventional serial interfaces, e.g., I²C, SPI, USB, SCIO, UNI/O, etc.

BACKGROUND

Present technology DAC devices store configuration information and input data in volatile memory. The configuration information and input data stored in the volatile memory are lost when operating power is removed from the DAC device and the associated volatile memory. For example, a DAC device may be used to output a programmable analog voltage. The programming bits, e.g., digital representation of the analog voltage, are stored in a DAC register which is volatile, thereby loosing its contents when powered down. Upon an initial power-up of the DAC device, the DAC register is either cleared or its contents are not predictable until the DAC register is programmed again. Thus the DAC register must be reprogrammed each time the DAC device is powered up. This necessitates additional program cycles of a master controller program so as to reprogram the DAC register. In many applications, DAC devices support operation of other devices in a system. For example, the DAC device may provide a reference voltage to other devices for proper operation thereof. Since the DAC register has to be reprogrammed, all other devices dependent upon the DAC device must wait (prevented from operating) until the DAC register contains the correct data.

DAC devices are becoming more prevalent in integrated circuits having both analog and digital functions, e.g., mixed signal devices. Typically, mixed signal devices (slaves) will communicate with a master device such as master control unit (MCU), e.g., microcontroller, microprocessor, digital signal processor, etc., over a communications bus. There may be more then one mixed signal slave device connected to the communications bus, thus each one of the mixed signal slave devices will need a device address. Generally the mixed signal device has either multiple address programming pins on the integrated circuit package, or the mixed signal device has a fixed address that is mask programmed during fabrication at the factory. For a three bit address, up to eight different integrated circuit fabrication masks are required. Having to mask program up to eight different addresses into mixed signal devices that are otherwise identical increases manufacturing time and costs, and results in having to stock and ship up to eight different parts. In addition, having mixed signal devices with non-field programmable addresses may become very inconvenient in certain applications.

SUMMARY

Therefore there is a need to prevent loss of the DAC device configuration and address information, and input data during a power down or power loss condition. If the DAC device outputs a preprogrammed output by itself immediately when it turns-on, then the overall system application reduces several initialization and calibration steps, and can thereby initialize the system with the same conditions all the time, even when there are power interruptions thereto. This will increase system operating efficiency and the useful range of applications for such a device.

A DAC device may have both volatile and non-volatile internal memory blocks. The non-volatile memory may be used to store configuration information, digital voltage values, e.g., data, and an address for the DAC device. The non-volatile memory may be for example, but is not limited to, electrically erasable and programmable read only memory (EEPROM), FLASH memory and the like. This data may be written into the internal non-volatile memory block at any time and the stored configuration information, digital data, e.g., voltage values; and DAC device address may thereby be protected from being lost during a power outage.

According to teachings of this disclosure, a non-volatile memory, e.g., EEPROM, FLASH, etc., may be part of the DAC device. The DAC/non-volatile memory device may thereby provide a preprogrammed output voltage whenever it is powered-up. However, unlike the conventional DAC devices, DAC devices with the non-volatile memory may need special interface communication protocols for effective operation of the DAC device. For example, the system master controller unit (MCU) requires a way to access the volatile memory (DAC register) and/or the non-volatile memory (e.g., EEPROM). Therefore, the non-volatile memory in the DAC device requires effective interface communication protocols with the MCU so that the MCU may access the DAC device's memories (both non-volatile and volatile memories) effectively. Since most of the mixed signal devices such as DAC, analog-to-digital (ADC), and digital potentiometer are operated by using a standard serial interface, e.g., I²C, SPI, USB, SCIO, UNI/O, etc., the interface communication protocols for communicating with the volatile and non-volatile memories of the DAC device may operate without violating the specifications of the existing serial communications protocols.

According to teachings of this disclosure, a serial data interface communication protocol may be used to operate the DAC device and the internal non-volatile memory over a serial data bus, e.g., I²C, SPI, USB, SCIO, UNI/O, etc. For example, but not limited to, one, two, three or four channel 12 bit DAC devices with non-volatile memory, wherein these DAC devices may incorporate the same non-volatile interface communication protocol. Using an interface communication protocol solves the following problems: (a) A user may read and/or write the configuration, address and data information into non-volatile or volatile memories with a simple command(s). This also reduces the interface communication time.

(b) A simple and yet effective command structure reduces the complexity of device interface circuits. (c) The same command structure may be used for reading from and writing to device test registers using the same integrated circuit package pin-out connections, thus eliminating the need for extra test interfaces.

It is advantageous to use a common serial communications protocol for mixed signal devices, e.g., both analog and digital circuit functions, even if different companies use their own interface protocols, a common protocol may emerge that is driven by customer demand.

An example problem: DAC device outputs a programmable analog voltage. The programming of bits are stored in a volatile DAC register which means its memory contents are cleared or not predictable at an initial power-up stage until it is reprogrammed. The user must reprogram the DAC register each time when it is powered-up. This requires that the system's master controller unit (MCU) use additional cycles to reprogram the DAC register. In many applications, DAC devices are used as a supporting device for other devices in systems. For example, the DAC device may provide a reference voltage to other devices to operate. If the DAC device outputs a preprogrammed output by itself immediately when it turns-on, then the overall application systems reduce several initialization and calibration steps, and can initialize the systems with the same conditions all the time, even when there are power interruptions thereto. This will increase systems efficiency and useful operability greatly.

According to the teachings of this disclosure, a solution to the aforementioned problem may be by having a non-volatile memory, e.g., EEPROM, FLASH, etc., as part of the DAC device. The DAC/non-volatile memory device may thereby provide a preprogrammed output voltage whenever it is powered-up. However, there may be a communications issue for controlling the non-volatile memory. For example, the system MCU needs a way to access the volatile memory (DAC Register) or non-volatile memory (EEPROM). Therefore, the non-volatile memory in the device requires effective interface communication protocols between the DAC device and the MCU. This allows the MCU to access the device's memories (both non-volatile and volatile memories) effectively. Since most of the mixed signal devices such as a DAC, ADC, and/or a digital potentiometer are operated by using a standard serial interface, e.g., I²C, SPI and the like, the necessary interface communication protocol may be operated within these standard serial interface specifications. The interface communication protocols disclosed herein do not violate existing serial communication specifications.

BRIEF DESCRIPTION OF THE DRAWINGS

A more complete understanding of the present disclosure may be acquired by referring to the following description taken in conjunction with the accompanying drawings wherein.

Figure 1:
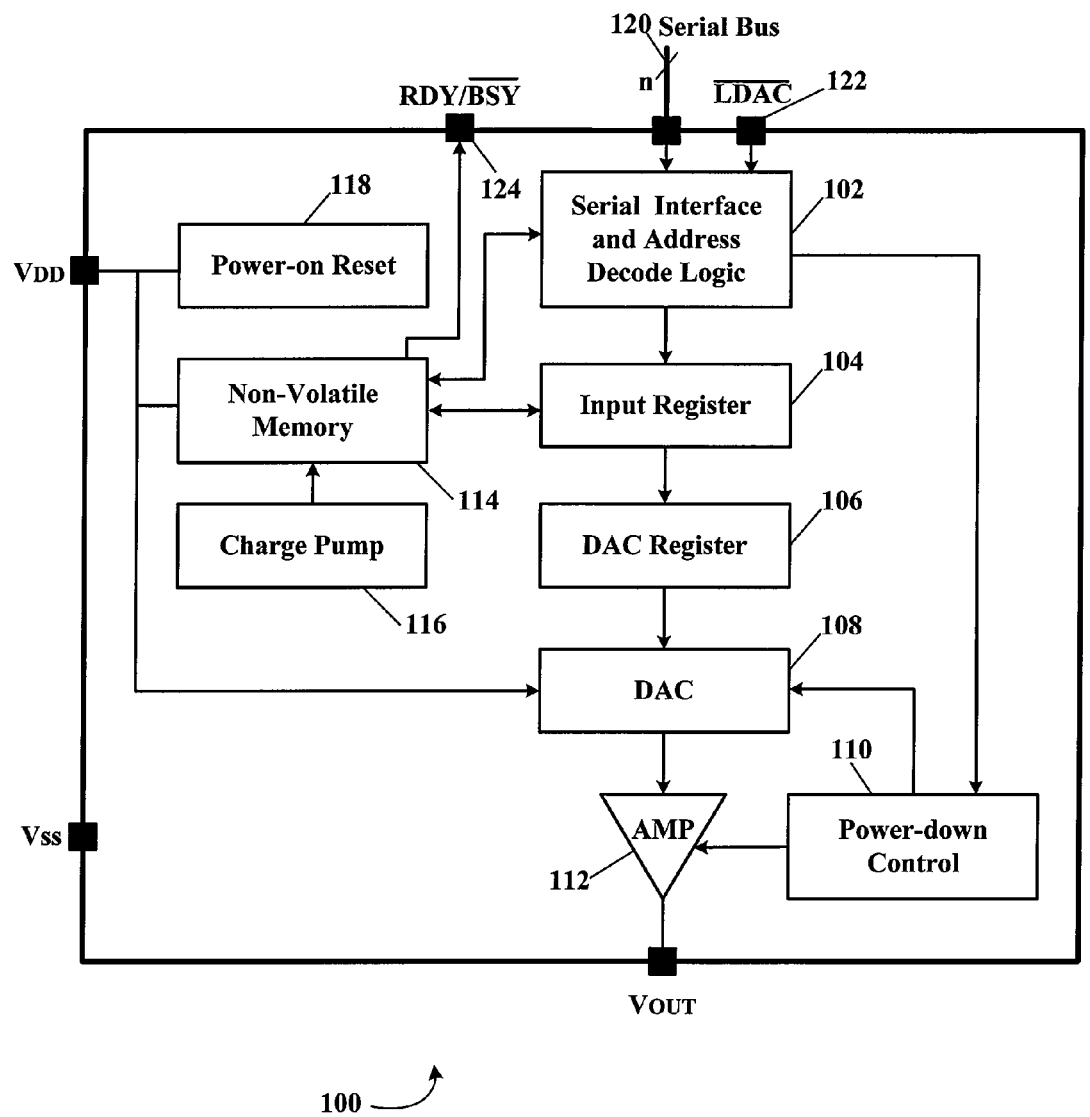
FIG. 1 illustrates a schematic block diagram of a device having a single channel digital-to-analog conversion (DAC) capability and non-volatile memory, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a device having a single digital-to-analog conversion (DAC) capability and non-volatile memory, according to a specific example embodiment of this disclosure. The device, generally represented by the numeral 100, may comprise a serial interface and address logic 102, an input register 104, a DAC register 106, a digital-to-analog converter (DAC) 108, power-down control 110, an analog amplifier 112, a non-volatile memory 114, a charge pump 116, and a power-on-reset (POR) circuit 118.

The non-volatile memory 114 may be, but is not limited to, an electrically erasable and programmable read only memory (EEPROM), FLASH memory, etc. For example, the non-volatile memory 114 may be used to store configuration register, DAC input data (e.g., 12 bits of a digital representation of the analog voltage that the DAC 108 is supposed to produce), address bits (e.g., 3 bits for I$^2$C address) and test mode trim bits. The charge pump 116 may be used for writing to the non-volatile memory 114. Power may be supplied to the device 100 at voltage terminals Vdd and Vss. The serial interface and address logic 102 is coupled to a serial data bus 120 of n-bit width, e.g., n=1, 2, 3, etc. Configuration and data values may be written to or read from the non-volatile memory 114 and/or the input register 104. The serial interface and address logic 102 determines whether the device 100 is being addressed by a bus master (not shown) over the serial bus 120. A specific programmable device address allows specific operation and selection from a number of devices 100. The device address is written to and stored in the non-volatile memory 114 so that a specific device address is maintained even when the device 100 has power removed therefrom. The DAC output register 106 may be loaded from the input register 104. Also, the contents of the non-volatile memory 114 may be transferred to the input register 104.

A load DAC output register input 122 may be used to (a) transfer the contents of the input register(s) 104 to the respective DAC output register(s) 106, (b) select a device 100 of interest in Read/Write Address Bit Commands, and (c) enter test mode. When there is a logic transition on the input 122, the contents of the input register(s) 104 may be loaded into the DAC output register(s) 108, thus generating a new analog voltage at the output of the analog amplifier 112 (Vout).

For selection of a device 100 of interest, a logic transition on the input 122 at a certain time during a command may be used to either read a device address or write a new device address into the selected device 100. Using the input 122 in this way allows determining the address programmed into a specific device 100 and also being able to change a specific device address when the device 100 is in an end use system without requiring removal of the device 100 and/or special test fixtures.

To enter a device test mode, a higher then normal voltage, e.g., 10 volts, may be applied to the input 122.

A ready/busy output 124 may be used to indicate when a write operation to the non-volatile memory 114 is completed.

Figure 2:
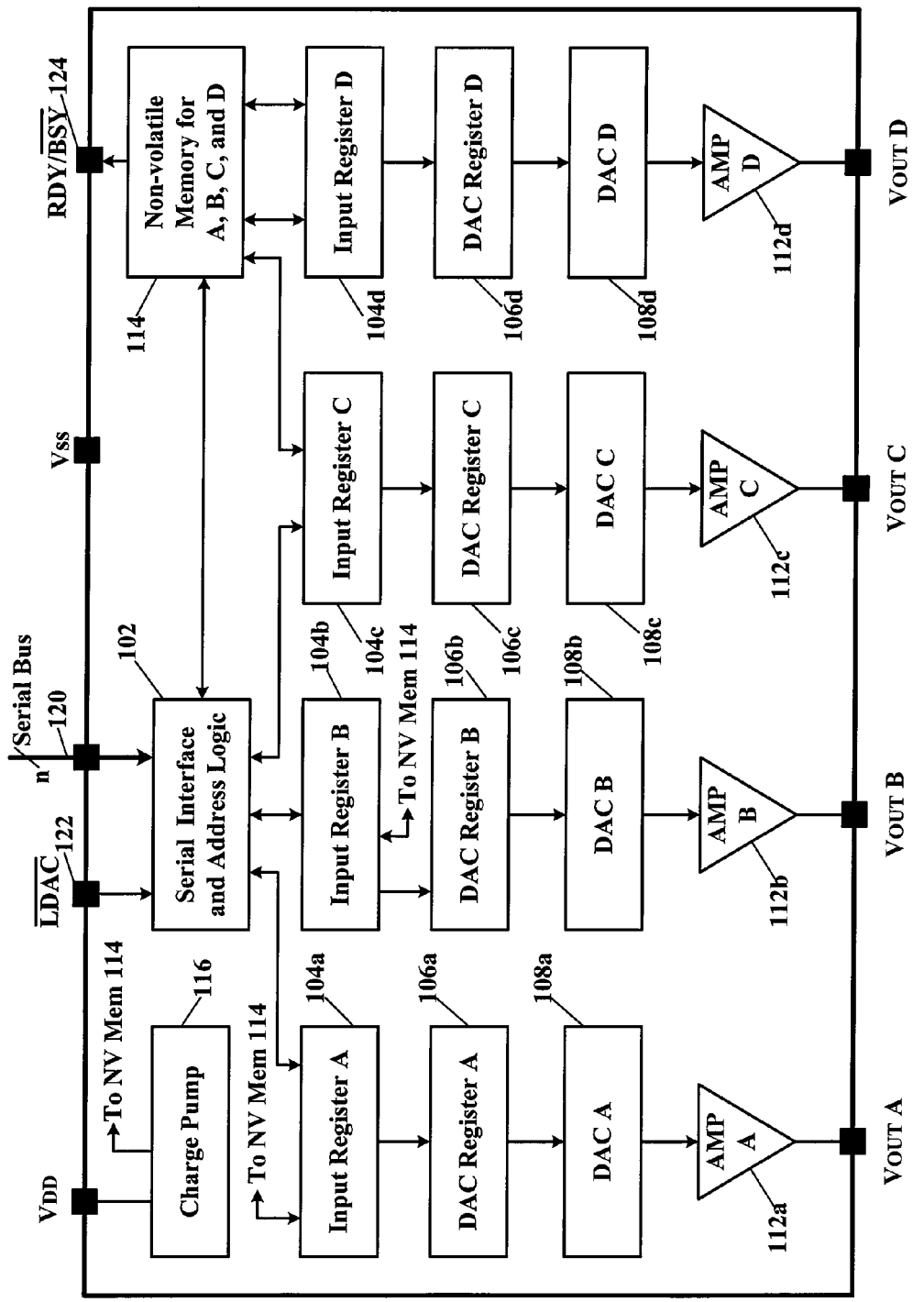
FIG. 2 illustrates a schematic block diagram of a device having a plurality of channels with digital-to-analog conversion (DAC) capabilities and non-volatile memories, according to another specific example embodiment of this disclosure.

Referring to FIG. 2, depicted is a schematic block diagram of a device having a plurality of channels with digital-to-analog conversion capabilities and non-volatile memories, according to another specific example embodiment of this disclosure. The device, generally represented by the numeral 200, may comprise a serial interface and logic 102, a plurality of input registers 104, a plurality of DAC registers 106, a plurality of digital-to-analog converters (DAC) 108, a plurality of analog amplifiers 112, a non-volatile memory 114, and a charge pump 116. Power-on-reset (POR) circuit 118 (FIG. 1), power-down control 110 (FIG. 1), an internal voltage reference and voltage reference value selection circuit are not shown but may also be part of the devices 100 and/or 200. Four ADC channels are shown but it is contemplated and within the scope of this disclosure that any number of ADC channels may be utilized in combination with the teachings of this disclosure.

The non-volatile memory 114 may be, but is not limited to, electrically erasable and programmable read only memory (EEPROM), FLASH memory, etc. For example, the non-volatile memory 114 may be used to store configuration register, DAC input data (e.g., 12 bits of a digital representation of the analog voltage that the DAC 108 is supposed to produce), address bits (e.g., 3 bits for I$^2$C address) and test mode trim bits. The charge pump 116 may be used for writing to the non-volatile memory 114. Power may be supplied to the device 100 at voltage terminals Vdd and Vss. The serial interface and logic 102 may have an input (/LDAC) for transferring DAC settings from serial input latches to output latches, e.g., DAC registers 106. The serial interface and logic 102 is coupled to a serial data bus of n-bit width, e.g., n=1, 2, 3, etc. Configuration and data values may be written to or read from the non-volatile memory 114 and/or the input registers 104. The DAC registers 106 may be loaded from the respective input registers 104. Also the contents of the non-volatile memory 114 may be transferred to the respective input registers 104. The load DAC output register input 122 and the ready/busy output 124 function as described hereinabove.

Normal Mode

A normal mode of the device allows user commands to write to and read from the device DAC registers and non-volatile memory during normal operational thereof.

Normal Mode Write Commands

Figure 3:
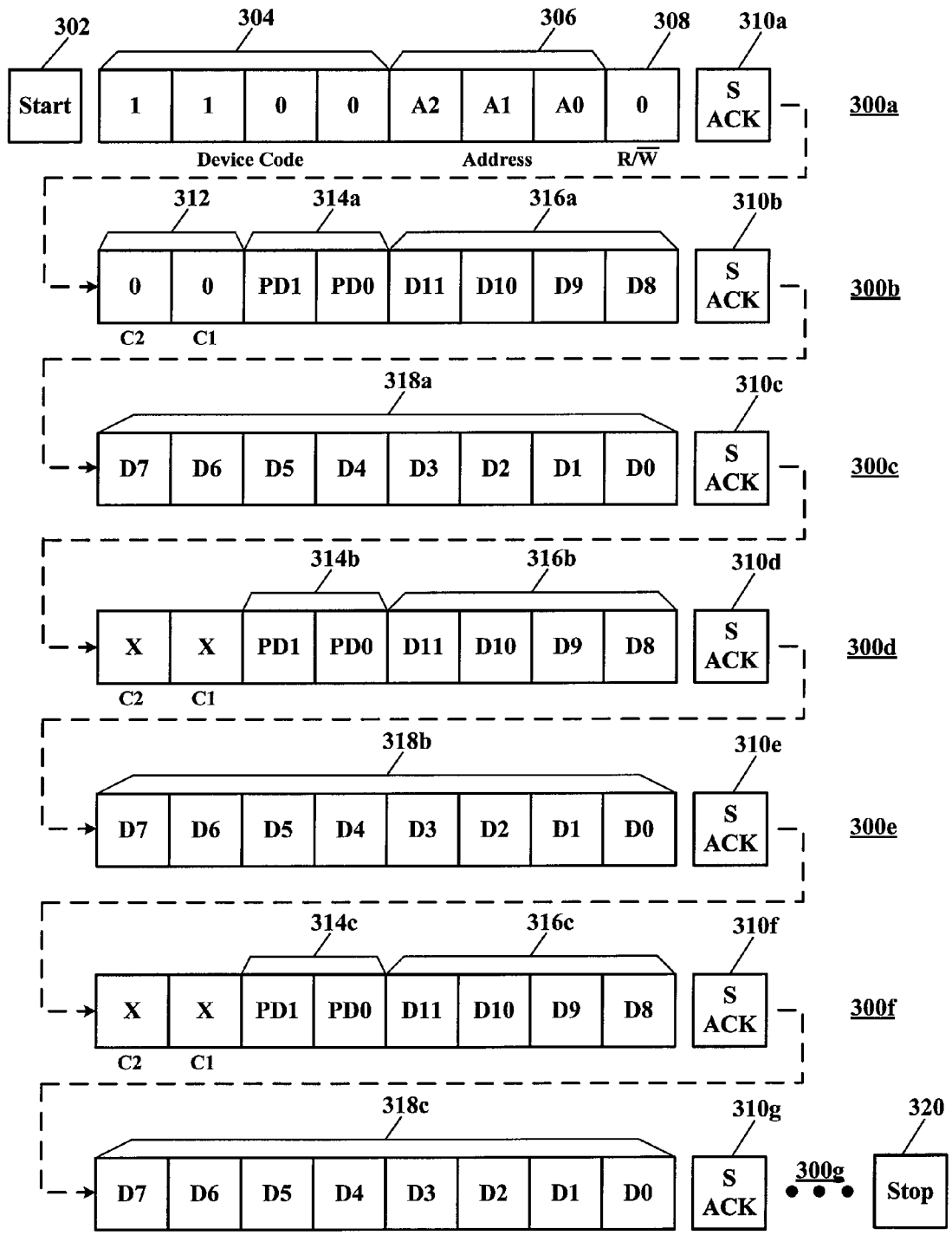
FIG. 3 illustrates a schematic byte diagram of an address, command and data protocol structure for fast mode sequentially writing to DAC input register(s)

Referring to FIG. 3, depicted is a schematic byte diagram of an address, command and data protocol structure for fast mode sequentially writing to DAC input register(s). The fast mode write command is comprised of a plurality of bytes 300 and may support, for example but is not limited to, 7-bit slave addressing. The slave address may contain a device code 304 comprising four fixed identification bits (e.g., 1100b) and three address 306 bits (A2, A1, A0) used to select one of up to eight (8) devices. The device code 304 may be preprogrammed during manufacture, and unique address bits 306 may be programmed into the device 100 or 200 for a specific application as more fully described hereinbelow.

The fast mode write command shown in FIG. 3 begins with a start bit 302 followed by a plurality of bytes 300 (8 bits each), each byte 300 is followed by a device (slave) acknowledge 310, and terminating with a stop bit 320. For this fast write command only the write command bits 312 (C2=0 and C1=0) are used. In subsequent bytes 300 the C2 and C1 bits are ignored, C2, C1=X (where X is a don't care).

The fast mode write command is used to sequentially update the input register(s) 104. The power down selection bits (PD1, PD0) 314 and the 12 bits of DAC input data bits (D11-D0) 316 and 318 are sequentially updated for each DAC channel (bytes for three DAC channels are shown in FIG. 3, bytes 300f and 300g would repeat for a fourth DAC channel). Data in the non-volatile memory 114 is not changed by the fast write command shown in FIG. 3.

The fast mode write command writes only the power-down selection bits 314 (PD1 and PD0) of the configuration register, and 12 bits (D11:D0) of DAC input data 316 and 318 of each DAC channel. The write data is loaded sequentially from the first channel to the last channel of the device. Each of the DAC input registers 104 are updated (written) at the acknowledge pulse of that channel's last input data byte. Once the DAC input registers 104 are loaded, the DAC registers 106 and Vout from each of the amplifiers 112 are updated at any time by changing the logic level at the load DAC output register input 122 (/LDAC). Non-volatile memory 114 is not affected.

Figure 4:
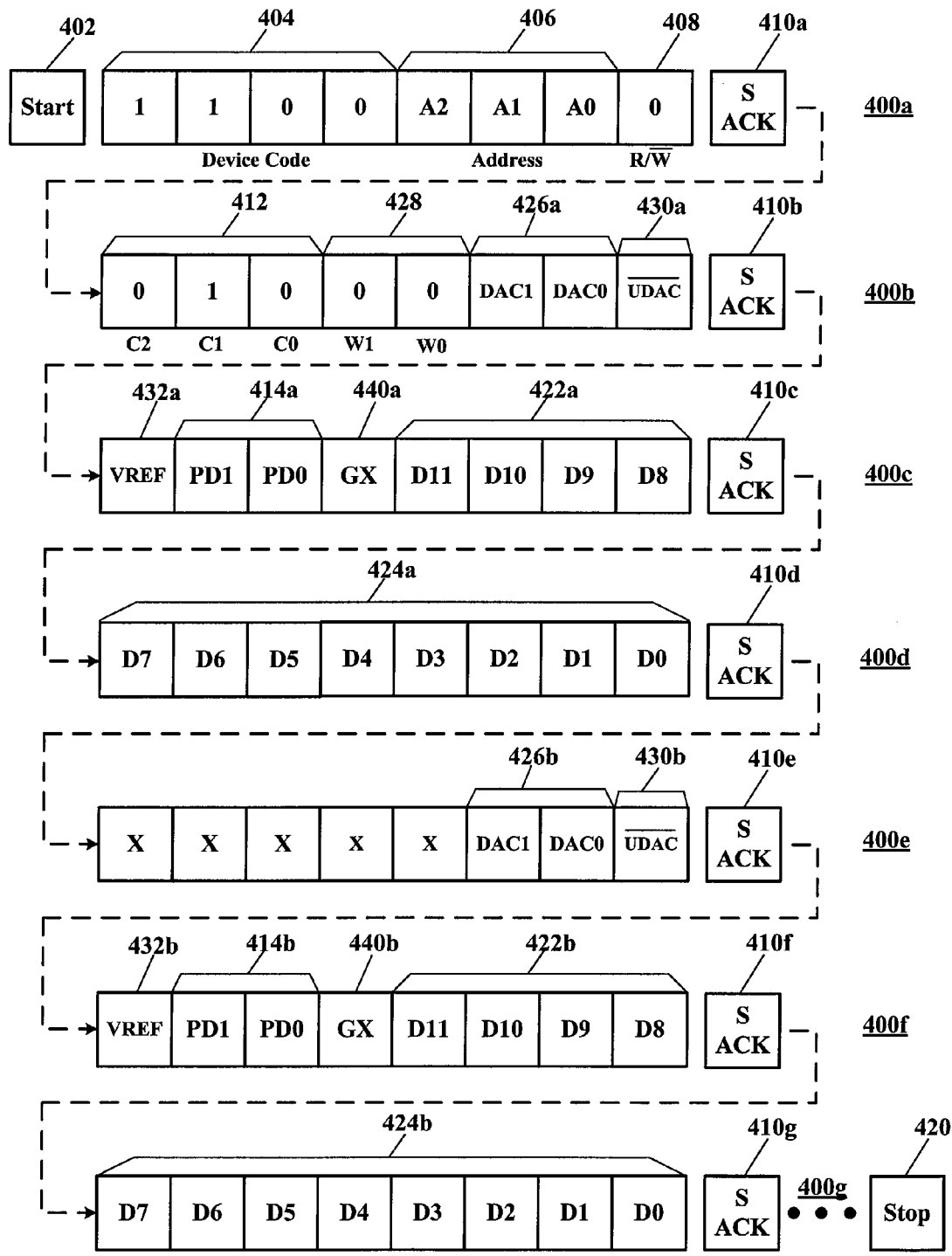
FIG. 4 illustrates a schematic byte diagram of an address, command and data protocol structure for writing to one DAC input register at a time.

Referring to FIG. 4, depicted is a schematic byte diagram of an address, command and data protocol structure for writing one DAC input register at a time. The multiple write command is comprised of a plurality of bytes 400 and may support, for example but is not limited to, 7-bit slave addressing. The slave address may contain a device code 404 comprising four fixed identification bits (e.g., 1100b) and three address bits 406 (A2, A1, A0) used to select one of one of up to eight (8) devices. The device code 404 may be preprogrammed during manufacture, and unique address bits 406 may be programmed into the non-volatile memory 114 of the device memory 100 or 200 for a specific application as more fully described hereinbelow.

The multiple write command shown in FIG. 4 begins with a start bit 402, followed by a plurality of bytes 400 (8 bits each), each byte 400 is followed by a device (slave) acknowledge 410, and terminates with a stop bit 420. A first byte comprises a device code 404, a device address 406 (A2, A1, A0) and a read/write bit 408 set to zero. A second byte 400b comprises write command type bits 412 (C2=0, C1=1 and C0=0), write function bits 428 (W1=0 and W0=0), DAC channel selection bits 426a (DAC1 and DAC0), and /UDAC bit 430a.

The multiple write command writes to one DAC input register 104 at a time. The DAC channel may be selected by using the DAC register selection bits 426 (DAC1 and DAC0), and only that channel is affected. More than one DAC register 106 may be written to by sending repeat bytes, e.g., bytes 400e, 400f and 400g, with the respective DAC register selection bits 426 for each DAC channel to be updated. Data in the non-volatile memory 114 is not changed by the fast write command shown in FIG. 4. A third byte 400c comprises configuration bits: Vref bit 432, power down selection bits 414a (PD1 and PD0), DAC gain selection bit 440a (GX) and the four most significant DAC data bits 422a (D11:D8). A fourth byte 400d comprises the least significant DAC data bits 424a (D7:D0).

The configuration register bits: vref bit 432a, power down selection bits 414a (PD1 and PD0) and DAC gain selection bit 440a (GX); and DAC input data bits (D11-D0) 422a and 424a may be updated after the fourth byte 400d acknowledge 410d if the logic level at the load DAC output register input 122 (/LDAC) is low or /UDAC bit 430 is cleared. Vout from the respective amplifier 112 may be updated using the /UDAC bit 430, a logic change at the DAC output register input 122 (/LDAC), or through a general call software update. When /UDAC bit 430 is at a first logic level, the Vout of the selected DAC channel is updated as soon as the fourth byte 400d is acknowledged 410d (the last byte of the selected DAC register) regardless of the logic state of the DAC output register input 122 (/LDAC). The DAC input data bits (D11-D0) 422 and 424 are the DAC input data of the selected DAC channel (bits 426). Bytes 400b, 400c and 400d are repeated for each of the next DAC channels to be updated but without the need for specifying the write command type bits 412a (C2, C1 and C0) and write function bits 428a (W1 and W0), X=don't care. For example, bytes 400e, 400f and 400g represent the update data necessary for a second DAC channel. Subsequent DAC channels may be similarly updated.

The information contained in the second, third and fourth bytes described above may be repeated for each DAC channel. Write command protocols for two instances of DAC channels are shown, however, write protocols for any number of DAC channels are contemplated herein (e.g., FIG. 2) and/or repeated for each one of the DAC channels until the stop bit 420 terminates the write command protocol.

Figure 5:
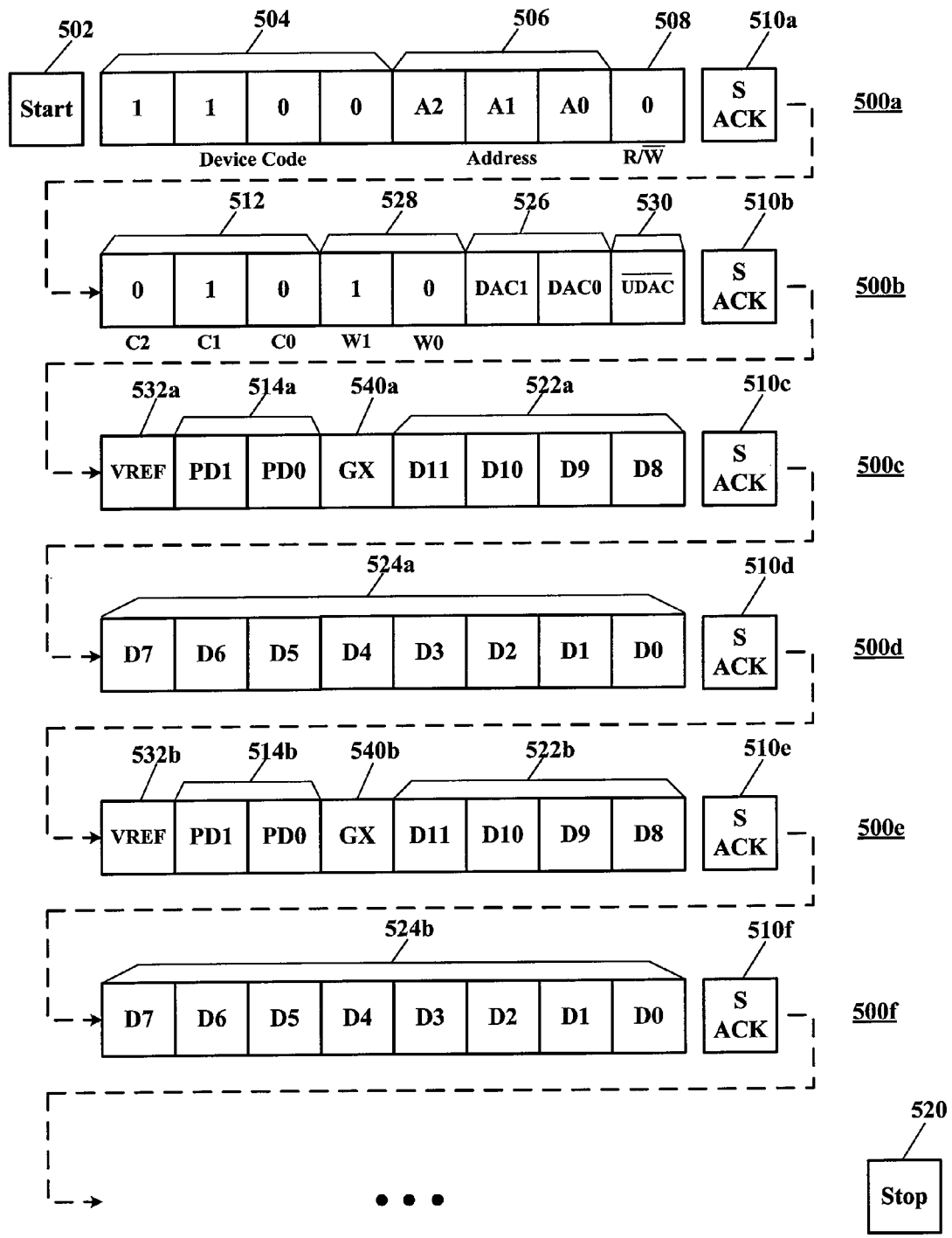
FIG. 5 illustrates a schematic byte diagram of an address, command and data protocol structure for sequentially writing to DAC input registers and associated locations in a non-volatile memory.

Referring to FIG. 5, depicted is a schematic byte diagram of an address, command and data protocol structure for sequentially writing to DAC input registers and associated non-volatile memory locations. The sequential write command is comprised of a plurality of bytes 500 and may support, for example but is not limited to, 7-bit slave addressing. The slave address may contain a device code 504 comprising four fixed identification bits (e.g., 1100b) and three address bits 506 (A2, A1, A0) used to select one of one of up to eight (8) devices. The device code 504 may be preprogrammed during manufacture, and unique address bits 506 may be programmed into the device 100 or 200 for a specific application as more fully described hereinbelow.

The sequential write command shown in FIG. 5 begins with a start bit 502, followed by a plurality of bytes 500 (8 bits each), each byte 500 is followed by a device (slave) acknowledge 510, and terminates with a stop bit 520. A first byte 500a comprises a device code 504, a device address 506 (A2, A1, A0) and a read/write bit 508 set to zero. A second byte 500b comprises write command type bits 512 (C2=0, C1=1 and C0=0), write function bits 528 (W1=1 and W0=0), DAC channel selection bits 526 (DAC1 and DAC0), and /UDAC bit 530.

The sequential write command writes the configuration register bits: vref bit 532, power down selection bits 514 (PD1 and PD0), DAC gain selection bit 540 (GX), and DAC input data bits (D11-D0) 522 and 524 to the DAC input registers 104 sequentially from the starting DAC channel to the last DAC channel, and this command also writes the same data sequentially to the non-volatile memory 114. The starting DAC channel is determined by the DAC register selection bits 526 (DAC1 and DAC0) in byte 500b. Subsequent DAC channels are written after the completion of each respective byte pair, e.g., bytes 500e and 500f for a second DAC channel. Additional DAC channels are just repeats of byte pairs up to the maximum number of DAC channels of the device 200.

When writing to the non-volatile memory 114, the ready/busy output 124 (FIGS. 1 and 2) remains at a first logic level until the write operation to the non-volatile memory 114 is completed. The ready/busy output 124 then returns to a second logic level. The ready/busy output 124 may be monitored by system software so as not to attempt a write operation to the non-volatile memory when the ready/busy output 124 is at the first logic level. Any command received when the ready/busy output 124 is at the first logic level will be ignored.

Figure 6:
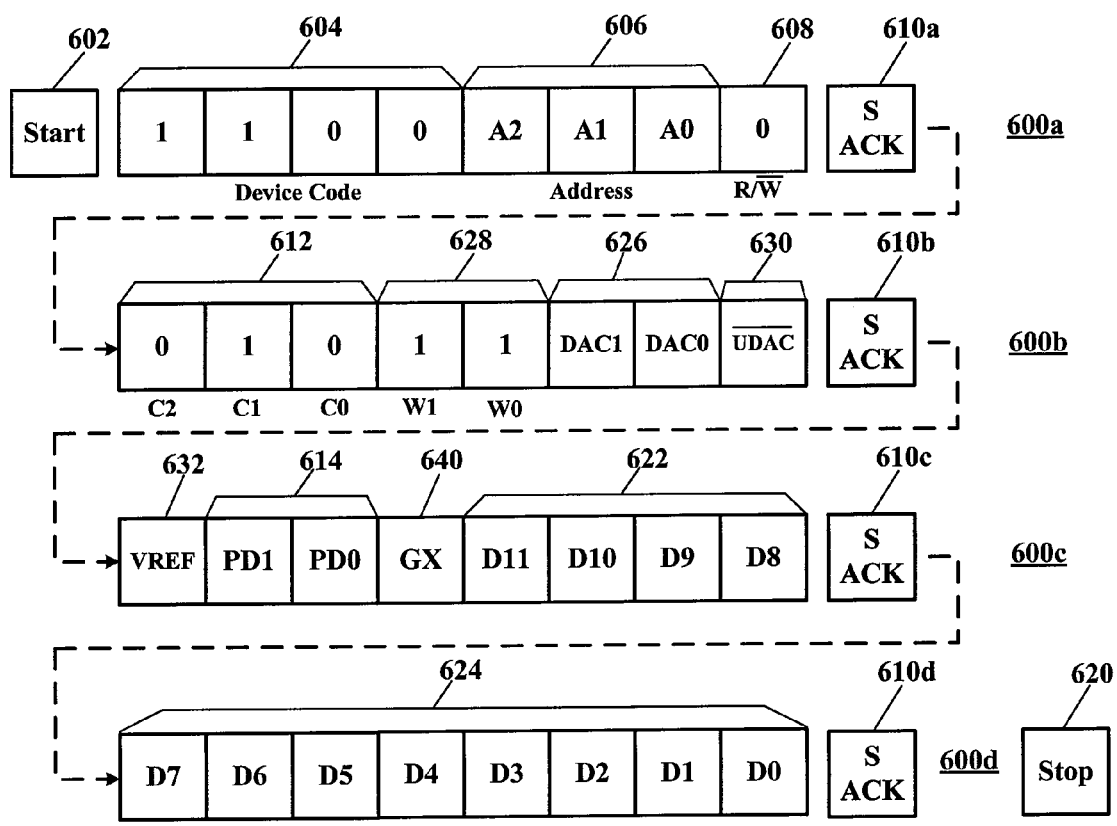
FIG. 6 illustrates a schematic byte diagram of an address, command and data protocol structure for writing to a single DAC input register and associated locations in a non-volatile memory.

Referring to FIG. 6, depicted is a schematic byte diagram of an address, command and data protocol structure for writing to a single DAC input register and associated non-volatile memory locations. The single write command is comprised of a plurality of bytes 600 and may support, for example but is not limited to, 7-bit slave addressing. The slave address may contain a device code 604 comprising four fixed identification bits (e.g., 1100b) and three address bits 606 (A2, A1, A0) used to select one of one of up to eight (8) devices. The device code 604 may be preprogrammed during manufacture, and unique address bits 606 may be programmed into the device 100 or 200 for a specific application as more fully described hereinbelow.

The single write command shown in FIG. 6 begins with a start bit 602, followed by a plurality of bytes 600 (8 bits each), each byte 600 is followed by a device (slave) acknowledge 610, and terminates with a stop bit 620. A first byte comprises a device code 604, a device address 606 (A2, A1, A0) and a read/write bit 608 set to zero. A second byte 600*b* comprises write command type bits 612 (C2=0, C1=1 and C0=0), write function bits 528 (W1=1 and W0=1), DAC channel selection bits 626 (DAC1 and DAC0), and /UDAC bit 630.

The single write command writes the configuration register bits: vref bit 632, power down selection bits 614 (PD1 and PD0) and DAC gain selection bit 640 (GX), and the DAC input data bits (D11-D0) 622 and 624 to the DAC input register 104 for the DAC channel specified by the DAC channel selection bits 626 (DAC1 and DAC0), and also writes the same information into associated locations in the non-volatile memory 114.

Figure 7:
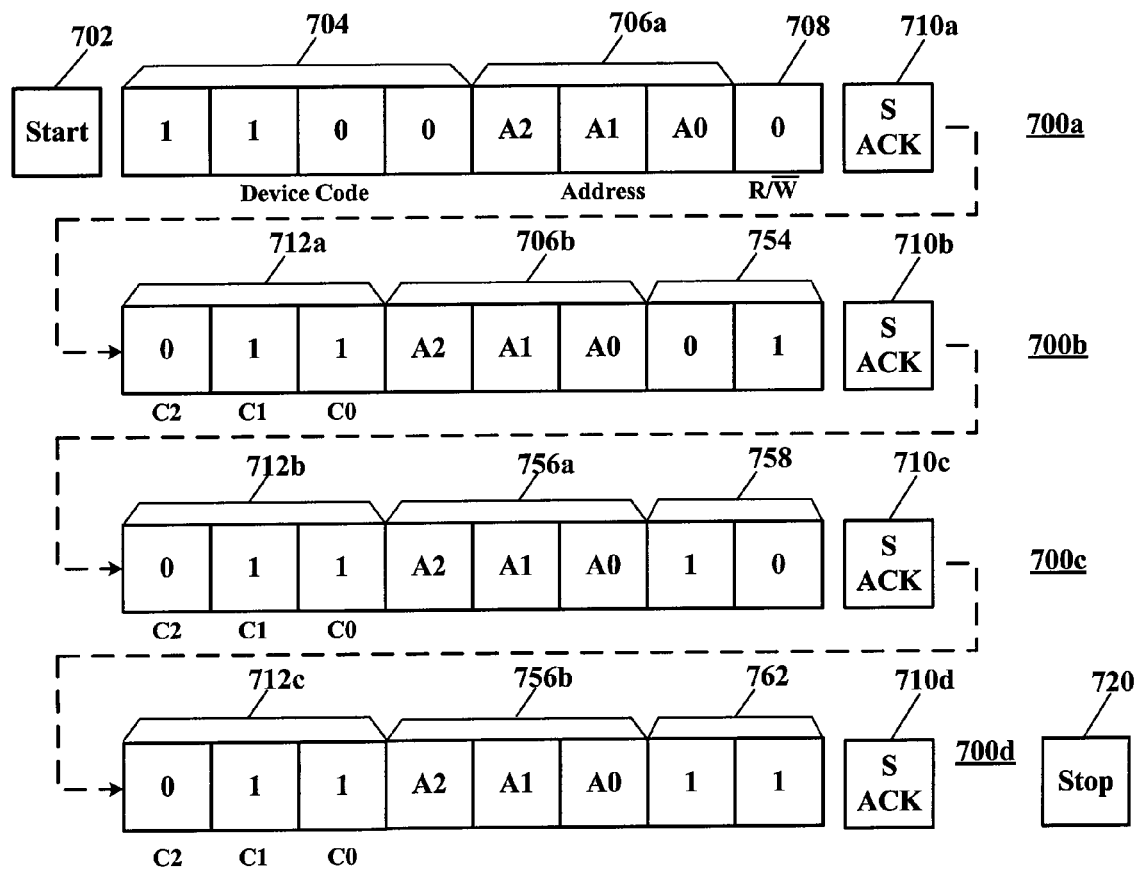
FIG. 7 illustrates a schematic byte diagram of an address, command and data protocol structure for writing a new address into the device.

Referring to FIG. 7, depicted is a schematic byte diagram of an address, command and data protocol structure for writing a new address into the device. The writing a new address command is comprised of a plurality of bytes 700 and may support, for example but is not limited to, 7-bit slave addressing. The slave address may contain a device code 704 comprising four fixed identification bits (e.g., 1100*b*) and three address bits 706 (A2, A1, A0) used to select one of up to eight (8) devices. The device code 704 may be preprogrammed during manufacture, and unique address bits 706 are programmed into the device 100 or 200. When the device receives the new address command, the current address contained in the three address bits 706 (A2, A1, A0) are replaced by overwriting these address bits in both the device register(s) and the associated locations of the non-volatile memory 114.

The writing of a new address command shown in FIG. 7 begins with a start bit 702, followed by a plurality of bytes 700 (8 bits each), each byte 700 is followed by a device (slave) acknowledge 710, and terminates with a stop bit 720. A first byte comprises a device code 704, a device address 706*a* (A2, A1, A0) and a read/write bit 708 set to zero. A second byte 700*b* comprises write command type bits 712*a* (C2=0, C1=1 and C0=1), the current device address 706*b* (A2, A1, A0), and a first bit pattern 754 (0, 1). A third byte 700*c* comprises write command type bits 712*b* (C2=0, C1=1 and C0=1), the new device address 756*a* (A2, A1, A0), and a second bit pattern 758 (1, 0). A fourth byte 700*d* comprises write command type bits 712*c* (C2=0, C1=1 and C0=1), the new device address 756*b* (A2, A1, A0) as confirmation, and a third bit pattern 762 (1, 1).

The writing of a new address command is only valid if there is a logic level transition at the load DAC output register input 122 (/LDAC) during the slave acknowledge 710*b* of the second byte 700*b*, and the logic level at the input 122 remains in its new state for at least the end of the third byte 700*c*. The load DAC output register input 122 (/LDAC) may be used to select a device when programming a new address therein.

Figure 8:
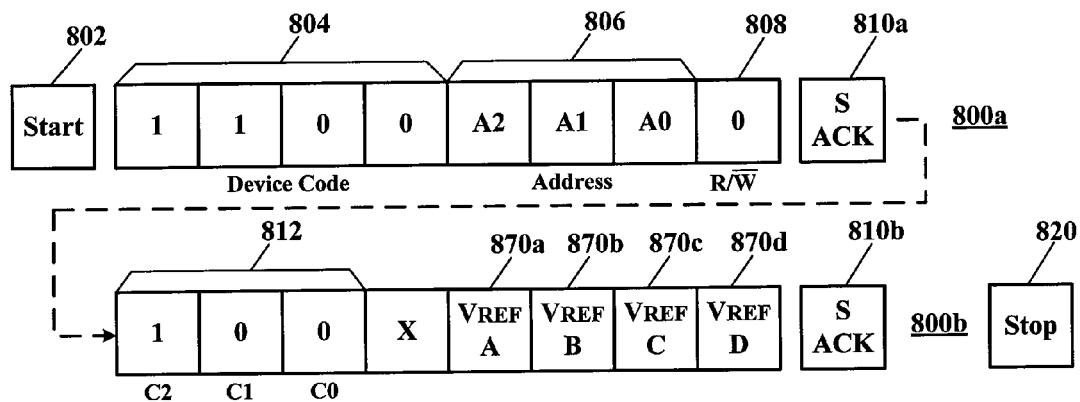
FIG. 8 illustrates a schematic byte diagram of an address, command and data protocol structure for changing selection of a voltage reference.

Referring to FIG. 8, depicted is a schematic byte diagram of an address, command and data protocol structure for changing selection of a voltage reference. The change voltage reference selection command is comprised of bytes 800*a* and 800*b*, and may support, for example but is not limited to, 7-bit slave addressing. The slave address may contain a device code 804 comprising four fixed identification bits (e.g., 1100*b*) and three address bits 806 (A2, A1, A0) used to select one of one of up to eight (8) devices. The device code 804 may be preprogrammed during manufacture, and unique address bits 806 are field programmable as described herein.

The change voltage reference select bits command shown in FIG. 8 begins with a start bit 802, followed by bytes 800*a* and 800*b* (8 bits each), each byte 800 is followed by a device (slave) acknowledge 810, and terminates with a stop bit 820. A first byte 800*a* comprises a device code 804, a device address 806 (A2, A1, A0) and a read/write bit 808 set to zero. A second byte 800*b* comprises write command type bits 812 (C2=1, C1=0 and C0=0), and DAC reference selection bits 870. Each of the DAC reference selection bits 870 may be used to select between either Vdd or Vref (internal or external, not shown) for its respective DAC channel, e.g., Vdd when the DAC reference selection bit 870 is at a first logic level or Vref when at a second logic level. Non-volatile memory 114 is not affected by this command.

Figure 9:
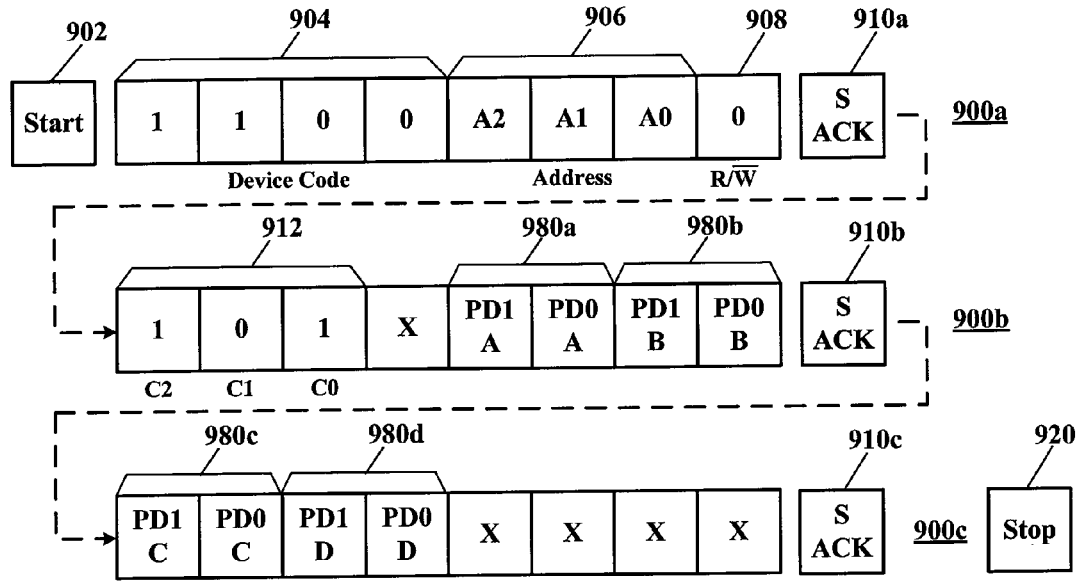
FIG. 9 illustrates a schematic byte diagram of an address, command and data protocol structure for writing power-down selection bits into the DAC input registers.

Referring to FIG. 9, depicted is a schematic byte diagram of an address, command and data protocol structure for writing power-down selection bits into the DAC input registers. The write power-down select bits command is comprised of bytes 900*a*, 900*b* and 900*c*, and may support, for example but is not limited to, 7-bit slave addressing. The slave address may contain a device code 904 comprising four fixed identification bits (e.g., 1100*b*) and three address bits 906 (A2, A1, A0) used to select one of one of up to eight (8) devices. The device code 904 may be preprogrammed during manufacture, and unique address bits 906 are field programmable as described herein.

The write power-down select bits command is used to select either a normal or power down mode for each of the DAC channels. Two power-down bits 980 (PD1, PD0) are used for each of the DAC channels, e.g., DAC channels A, B, C and D. When a normal mode is selected for a DAC channel, there will an analog voltage output. When a power down mode is selected, there will be no analog voltage output, instead a fixed resistance value to ground or common will be substituted depending upon the logic values of the two power-down bits 980 (PD1, PD0).

The write power-down select bits command shown in FIG. 9 begins with a start bit 902, followed by bytes 900*a*, 900*b* and 900*c* (8 bits each), each byte 900 is followed by a device (slave) acknowledge 910, and terminates with a stop bit 920. A first byte 900*a* comprises a device code 904, a device address 906 (A2, A1, A0) and a read/write bit 508 set to zero. A second byte 900*b* comprises write command type bits 812 (C2=1, C1=0 and C0=1), and power-down bits 980*a* and 980*b*. A third byte 900*c* may comprise power-down bits 980*c* and 980*d* if those DAC channels are implemented in the device 200. Non-volatile memory 114 is not affected by this command.

Figure 10:
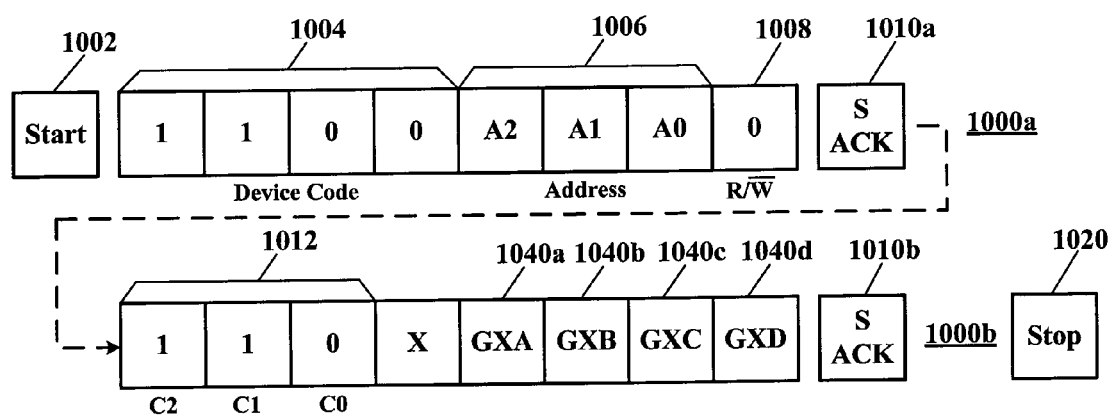
FIG. 10 illustrates a schematic byte diagram of an address, command and data protocol structure for writing gain selection bits to the DAC input registers.

Referring to FIG. 10, depicted is a schematic byte diagram of an address, command and data protocol structure for writing gain selection bits to the DAC input registers. The write gain selection bits to the DAC input registers command is comprised of bytes 1000*a* and 1000*b*, and may support, for example but is not limited to, 7-bit slave addressing. The slave address may contain a device code 1004 comprising four fixed identification bits (e.g., 1100*b*) and three address bits 1006 (A2, A1, A0) used to select one of one of up to eight (8) devices. The device code 1004 may be preprogrammed during manufacture, and unique address bits 1006 are field programmable as described herein.

The write gain selection bits to the DAC input registers command begins with a start bit 1002, followed by bytes 1000*a* and 1000*b* (8 bits each), each byte 1000 is followed by a device (slave) acknowledge 1010, and terminates with a stop bit 1020. A first byte 1000*a* comprises a device code

1004, a device address 1006 (A2, A1, A0) and a read/write bit 1008 set to zero. A second byte 1000*b* comprises write command type bits 1012 (C2=1, C1=1 and C0=0), and gain selection bits 1040. Each of the gain selection bits 1040 may be used to select the gain for its respective DAC channel, e.g., gain of one when the gain selection bit 1040 is at a first logic level or gain of two when at a second logic level. Non-volatile memory 114 is not affected by this command.

Read Command and Output Data Format

If the read/write bit (X08) in the first byte of each command is set to a logic "high" (1), then the device enters a read mode. There are two types of read modes: (a) normal read mode for reading register data, and (b) test mode read for accessing lock and trim bits. The test mode read may be entered into by asserting a high voltage on the load DAC output register input 122 (/LDAC). The read command executes only when the ready/busy output 124 indicates that the non-volatile memory 114 is not busy.

Figure 11A:
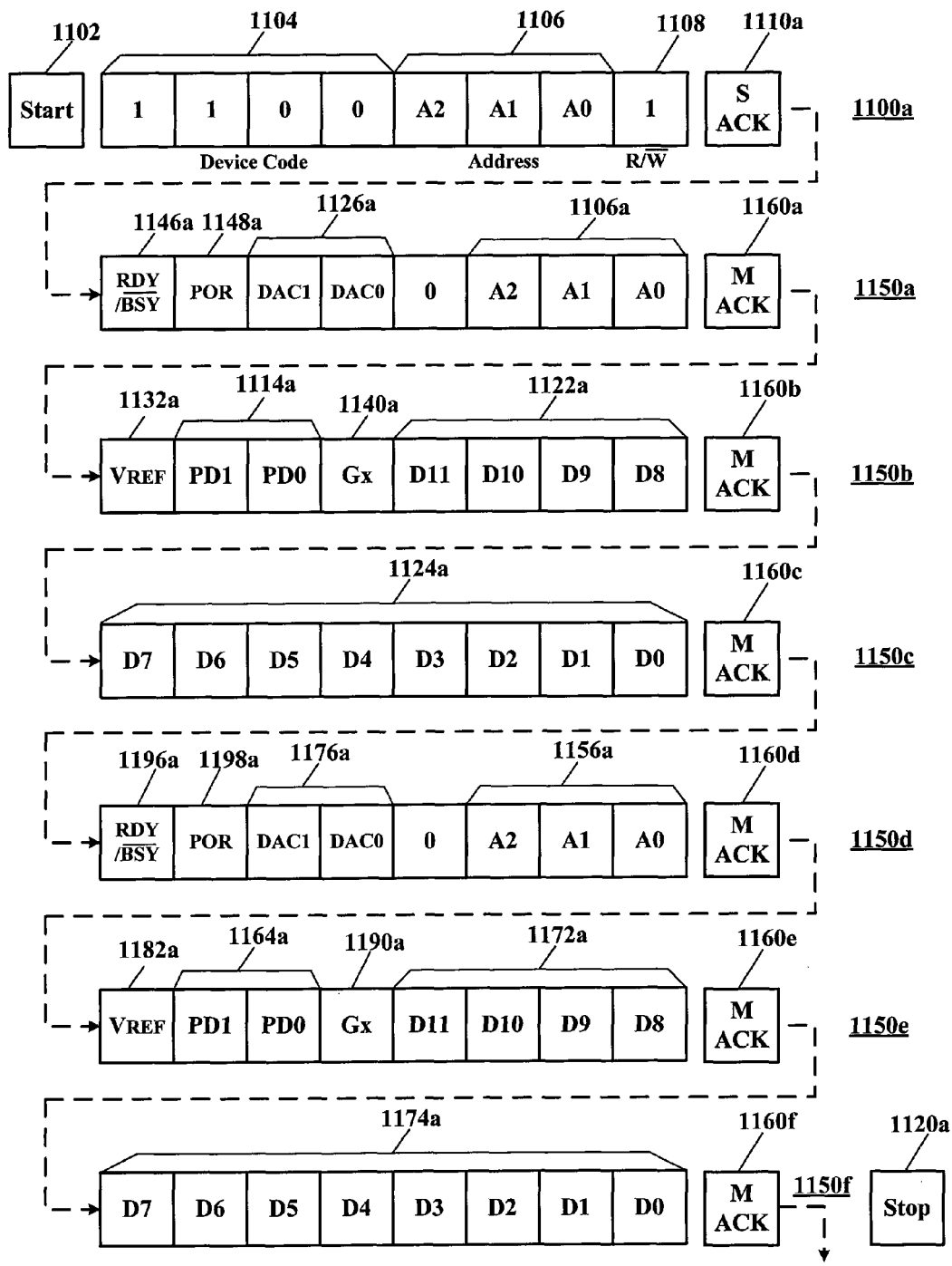
FIGS. 11a-11d illustrate schematic byte diagrams of an address, command and data protocol structures for reading in normal mode the DAC input register and non-volatile memory of one or more DAC devices.

Referring to FIGS. 11*a*-11*d*, depicted are schematic byte diagrams of an address, command and data protocol structures for reading in normal mode the DAC input register and non-volatile memory of one or more DAC devices. Referring now to FIG. 11*a*, the read command in normal mode begins with a start bit 1102 followed by a first byte 1100*a* sent by the bus master, e.g., a digital processor (not shown), wherein the first byte 1100*a* comprises a device code 1104 having four fixed identification bits (e.g., 1100*b*), three address bits 1106 (A2, A1, A0) used to select one of one of up to eight (8) devices, and a read/write bit 1108 (set to logic 1 indicating a read operation). Once the first byte of this read command from the bus master is finished, a slave acknowledge 1110*a* is asserted. The device code 1104 may be preprogrammed during manufacture, and unique address bits 1106 are field programmable as described herein.

Next a first slave byte 1150*a* is sent by the slave device. The first slave byte 1150*a* comprises the present status of the following data contained in the DAC register 106 of DAC channel A (FIG. 2): a ready/busy bit 1146*a* that indicates the completion status of a write to the non-volatile memory 114 (e.g., logic 1 indicates write complete, logic 0 indicates otherwise), the present status of the associated power-on-reset bit 1148*a*, the DAC channel indicated in the selection bits 1126*a* (DAC1, DAC0), a zero (0), and the three address bits 1106*a* (A2, A1, A0) of the device. After the first slave byte 1150*a* has been read by the bus master, the bus master sends a master acknowledge 1160*a*.

After the slave device receives the master acknowledge 1160*a*, a second slave byte 1150*b* is sent by the slave device. The second slave byte 1150*b* comprises the following data contained in the DAC register 106 of DAC channel A (FIG. 2): Vref 1132*a* status, power down selection bits 1114*a* (PD1 and PD0) status, the DAC gain selection bit 1140*a* (GX) status, and the four most significant DAC data bits 1122*a* (D11:D8) associated with the DAC channel indicated in the selection bits 1126*a*. After the second slave byte 1150*b* has been read by the bus master, the bus master sends a master acknowledge 1160*b*.

After the slave device receives the master acknowledge 1160*b*, a third slave byte 1150*c* is sent by the slave device. The third slave byte 1150*c* comprises the eight (8) least significant data bits 1124*a* (D7:D0) contained in the DAC register 106 associated with the DAC channel indicated in the selection bits 1126*a*. Bytes 1150*a*-1150*c* comprise the present contents of the DAC register of the indicated DAC channel 1126*a* (DAC1, DAC0). After the third slave byte 1150*c* has been read by the bus master, the bus master sends a master acknowledge 1160*c*.

Then the addressed slave device sends a fourth slave byte 1150*d* indicating the present status of the data contents contained in the non-volatile memory 114. The fourth slave byte 1150*d* comprises a ready/busy bit 1196*a* that indicates the completion status of a write to the non-volatile memory 114 (e.g., logic 1 indicates write complete, logic 0 indicates otherwise), the present status of the associated power-on-reset bit 1198*a*, the DAC channel indicated in the selection bits 1176*a* (DAC1, DAC0), a zero (0), and the three address bits 1156*b* (A2, A1, A0). After the fourth slave byte 1150*d* has been read by the bus master, the bus master sends a master acknowledge 1160*d*.

After the slave device receives the master acknowledge 1160*d*, a fifth slave byte 1150*e* is sent by the slave device. The fifth slave byte 1150*e* comprises the following data contained in the non-volatile memory 114: Vref 1182*a* status, power down selection bits 1164*a* (PD1 and PD0) status, the DAC gain selection bit 1190*a* (GX) status, and the four most significant DAC data bits 1172*a* (D11:D8) associated with the DAC channel indicated in the selection bits 1176*a*. After the fifth slave byte 1150*e* has been read by the bus master, the bus master sends a master acknowledge 1160*e*.

After the slave device receives the master acknowledge 1160*e*, a sixth slave byte 1150*f* is sent by the slave device. The sixth slave byte 1150*f* comprises the eight (8) least significant data bits 1174*a* (D7:D0) contained in the non-volatile memory 114 associated with the DAC channel indicated in the selection bits 1176*a*. Bytes 1150*d*-1150*f* comprise the present contents of the non-volatile memory 114 of the indicated DAC channel 1176*a* (DAC1, DAC0). After the sixth slave byte 1150*f* has been read by the bus master, the bus master sends a master acknowledge 1160*f*, and a stop bit 1120*a* is asserted on the serial bus 120.

Figure 11B:
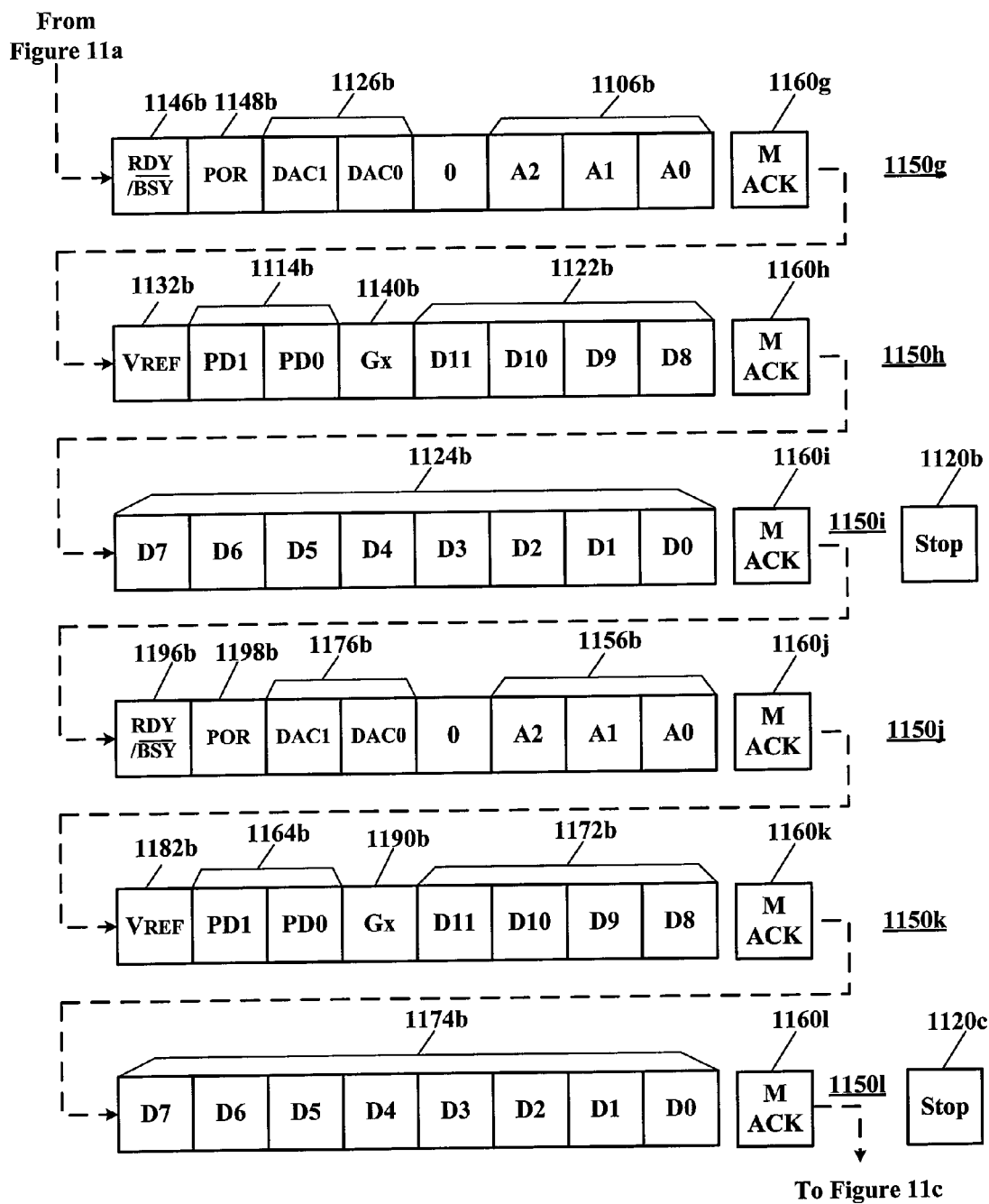
Figure 11C:
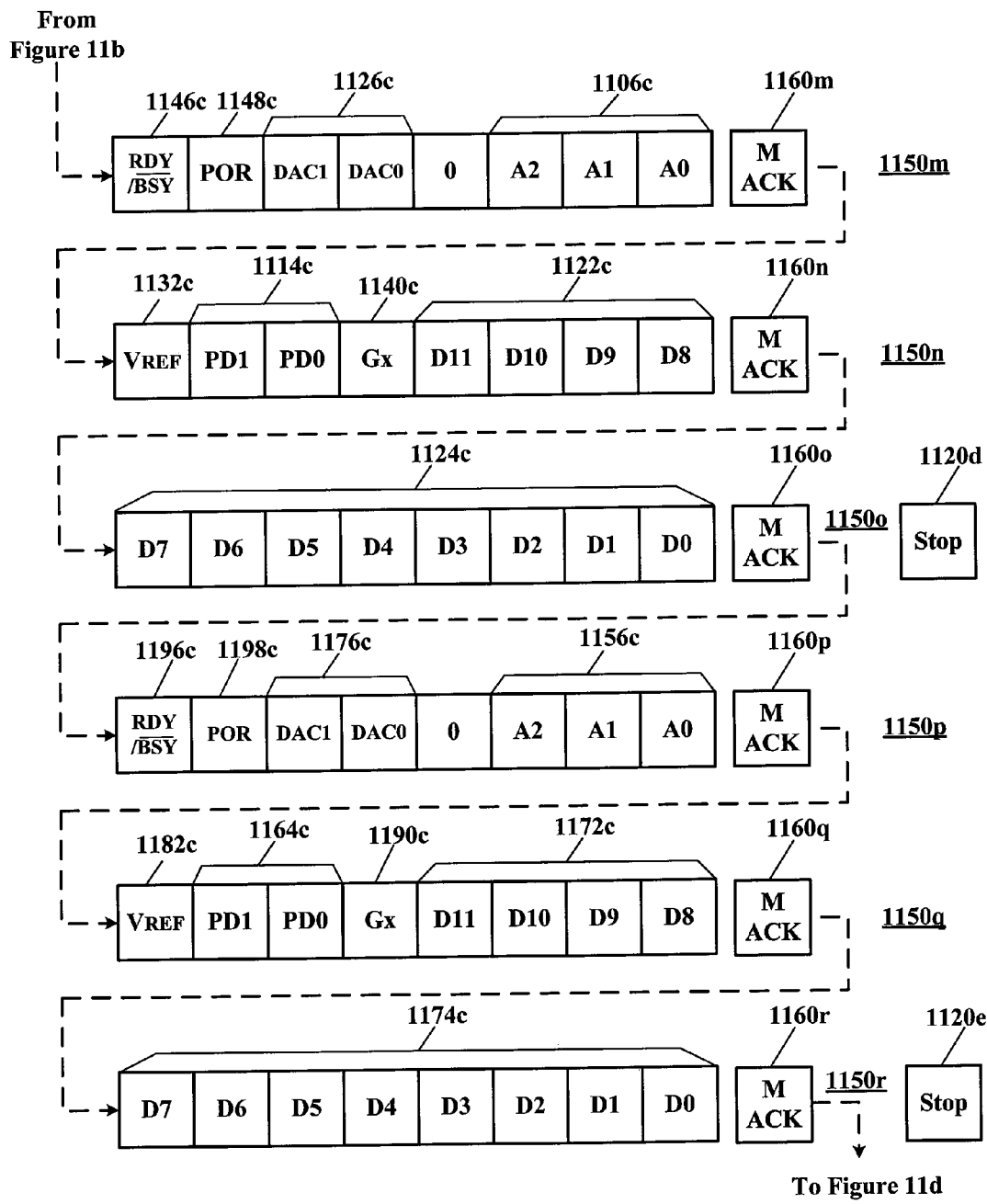
Figure 11D:
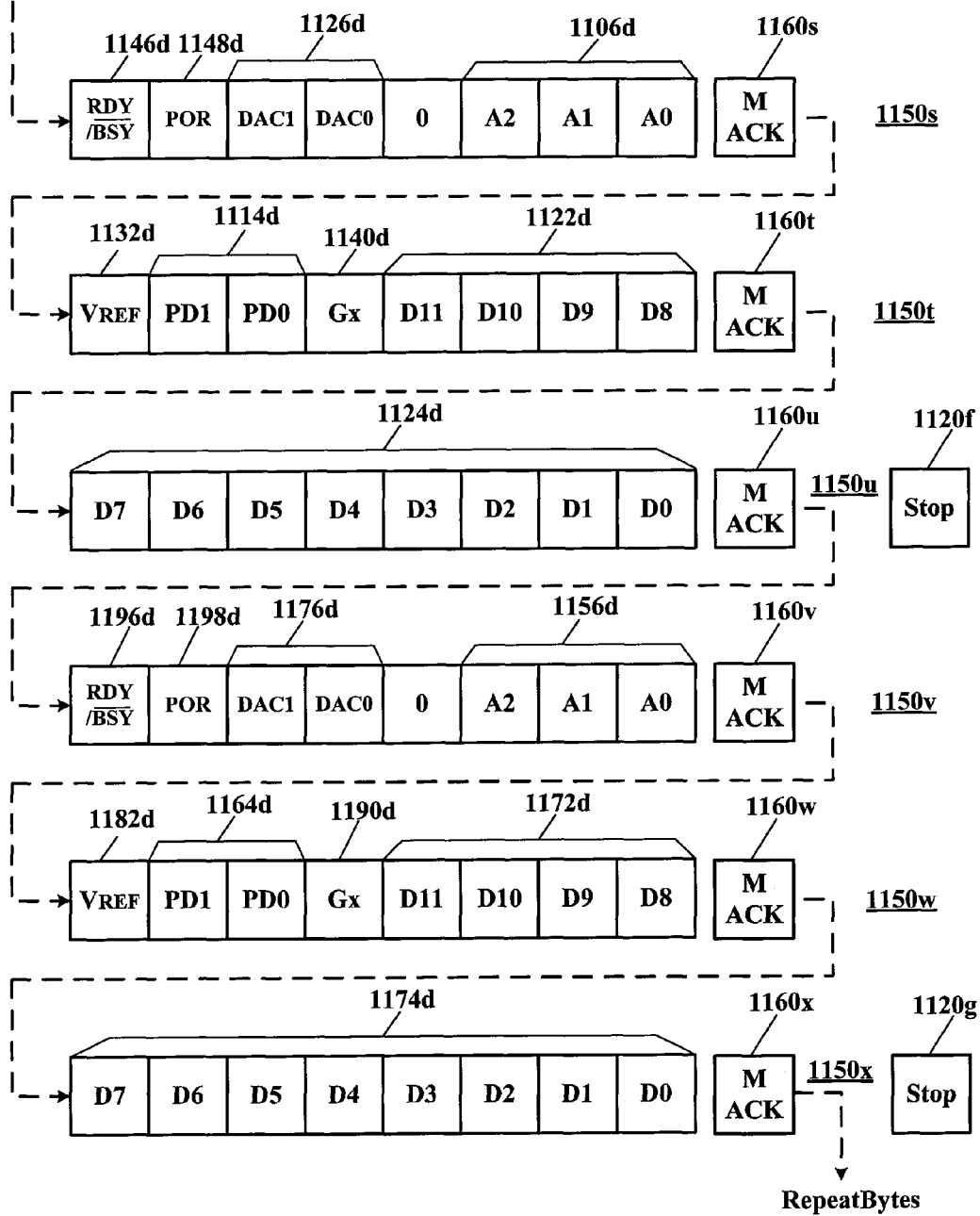

FIG. 11*b* shows the seventh (7th) through the twelfth (12th) slave bytes 1150*g*-1150*l* that may be used to supply all of the previously mentioned status and data for the next DAC channel B (FIG. 2). FIG. 11*c* shows the thirteenth (13th) through the eighteenth (18th) slave bytes 1150*m*-1150*r* that may be used to supply all of the previously mentioned status and data for the next DAC channel C (FIG. 2), if used. FIG. 11*d* shows the nineteenth (19th) through the twenty-third (23rd) slave bytes 1150*s*-1150*x* that may be used to supply all of the previously mentioned respective status and data for the next DAC channel D (FIG. 2), if used. A stop bit 1120 is asserted by the bus master (not shown) after the completion of reading the information for each subsequent DAC register 106 and associated non-volatile memory 114. This reading in normal mode command will terminate with a stop bit 1120 after the last DAC channel is read. The repeat byte can start after sequentially reading all of the DAC registers and non-volatile memory.

Test Mode

A test mode of the device may entered into when the device receives a "Read/Write Command for Test Mode" while a high voltage, e.g., about 10 volts, is applied to the load DAC output register input 122 (/LDAC). No specific device address is required since only the device under test will have a high voltage at its input 122.

Test Mode Write Commands

Figure 12:
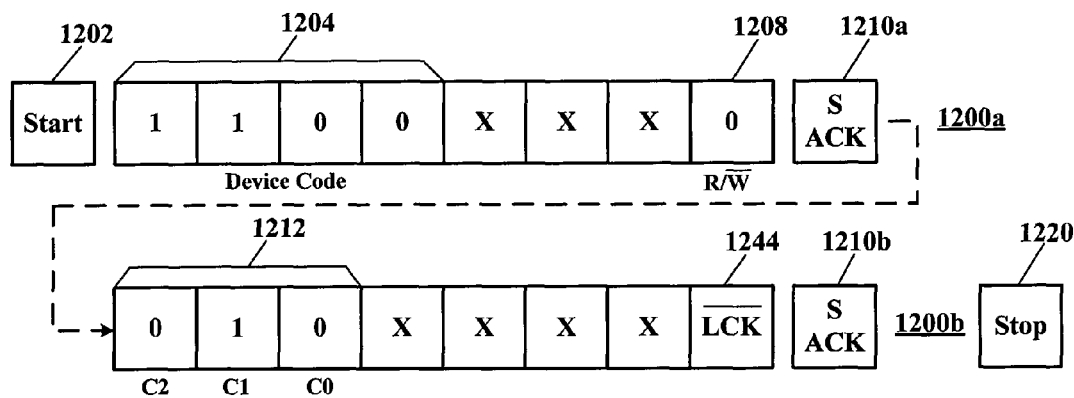
FIG. 12 illustrates a schematic byte diagram of a test mode address, command and data protocol structure for writing a lock bit to the DAC input registers.

Referring to FIG. 12, depicted is a schematic byte diagram of a test mode address, command and data protocol structure for writing a lock bit to the DAC input registers. The write lock bit command is comprised of bytes 1200*a* and 1200*b*, and begins with a start bit 1202, followed by bytes 1200*a* and 1200*b* (8 bits each), each byte 1200 is followed by a device (slave) acknowledge 1210, and terminates with a stop bit 1220. A first byte 1200*a* comprises a device code 1204, and a read/write bit 1208 set to zero. A second byte 1200*b* comprises write command type bits 1212 (C2=0, C1=1 and C0=0), and lock bit 1244. Non-volatile memory 114 is not affected by this command. The lock bit 1244 may be cleared and set by the write lock bit command. The lock bit 1244 prevents unauthorized modification of the contents of the non-volatile memories 114 of the DAC devices 100 and 200. A write command in test mode may be executed when the lock bit 1244 is at a first logic level, e.g., logic 0, and locked from execution when at a second logic level, e.g., logic 1.

Figure 13:
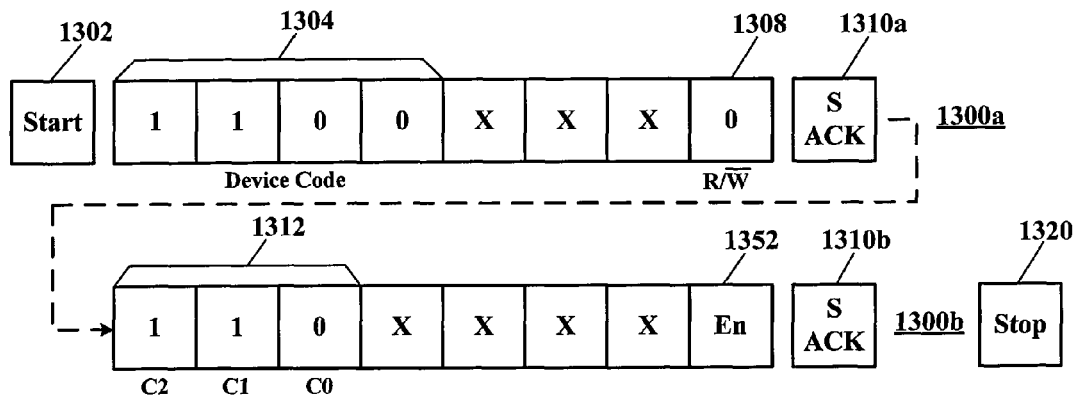
FIG. 13 illustrates a schematic byte diagram of a test mode address, command and data protocol structure for writing contents of the DAC input registers to non-volatile memory.

Referring to FIG. 13, depicted is a schematic byte diagram of a test mode address, command and data protocol structure for writing contents of the DAC input registers to non-volatile memory. The write enable bit command is comprised of bytes 1300*a* and 1300*b*, and begins with a start bit 1302, followed by bytes 1300*a* and 1300*b* (8 bits each), each byte 1300 is followed by a device (slave) acknowledge 1310, and terminates with a stop bit 1320. A first byte 1300*a* comprises a device code 1304, and a read/write bit 1308 set to zero. A second byte 1300*b* comprises write command type bits 812 (C2=1, C1=1 and C0=0), and enable bit 1352. When the enable bit 1352 is set, the contents of the associated DAC channel registers are written to the non-volatile memory 114. The enable bit 1352 is cleared and set by the write enable bit command.

Figure 14:
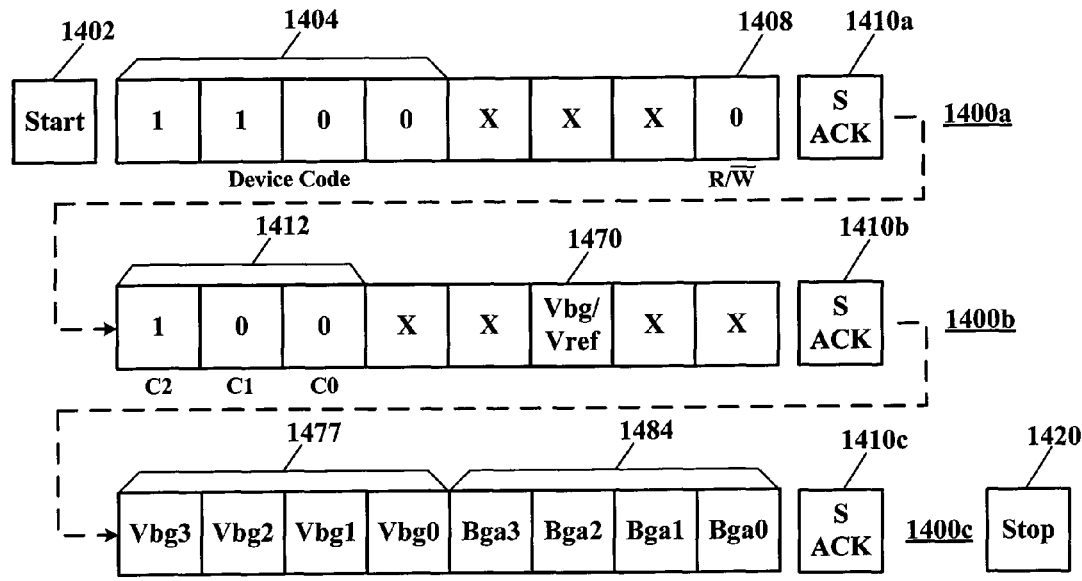
FIG. 14 illustrates a schematic byte diagram of a test mode address, command and data protocol structure for writing Bandgap voltage reference trim bits to the DAC input registers.

Referring to FIG. 14, depicted is a schematic byte diagram of a test mode address, command and data protocol structure for writing Bandgap voltage reference trim bits to the DAC input registers. The write Bandgap voltage reference trim bits command is comprised of bytes 1400*a*, 1400*b* and 1400*c*, and begins with a start bit 1402, followed by bytes 1400*a*, 1400*b* and 1400*c* (8 bits each), each byte 1400 is followed by a device (slave) acknowledge 1410, and terminates with a stop bit 1420 at the end of byte 1400*c*. A first byte 1400*a* comprises a device code 1404, and a read/write bit 1408 set to zero. A second byte 1400*b* comprises write command type bits 1412 (C2=1, C1=0 and C0=0), and voltage reference selection bit 1470. A third byte 1400*c* comprises Bandgap absolute value trim bits 1477 (Vbg3, Vbg2, Vbg1 and Vbg0) and Bandgap amplifier offset trim bits 1484 (Bba3, Bba2, Bba1 and Bba0).

Figure 15:
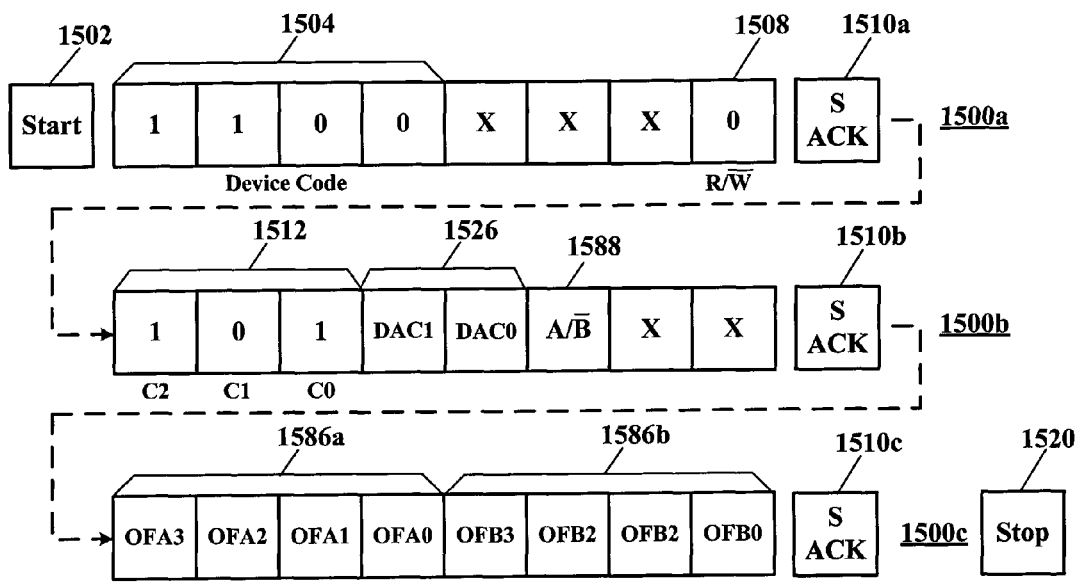
FIG. 15 illustrates a schematic byte diagram of a test mode address, command and data protocol structure for writing buffer offset trim bits to the DAC input registers.

Referring to FIG. 15, depicted is a schematic byte diagram of a test mode address, command and data protocol structure for writing buffer offset trim bits to the DAC input registers. The write buffer offset trim bits command is comprised of bytes 1500*a*, 1500*b* and 1500*c*, and begins with a start bit 1502, followed by bytes 1500*a*, 1500*b* and 1500*c* (8 bits each), each byte 1500 is followed by a device (slave) acknowledge 1510, and terminates with a stop bit 1520 at the end of byte 1500*c*. A first byte 1500*a* comprises a device code 1504, and a read/write bit 1508 set to zero. A second byte 1500*b* comprises write command type bits 1512 (C2=1, C1=0 and C0=1), DAC selection bits 1526 (DAC1, DAC0), and buffer amplifier selection bit 1588. A third byte 1500*c* comprises buffer amplifier A offset value trim bits 1586*a* and buffer amplifier B offset value trim bits 1586*b*.

Test Mode Read Command

Figure 16:
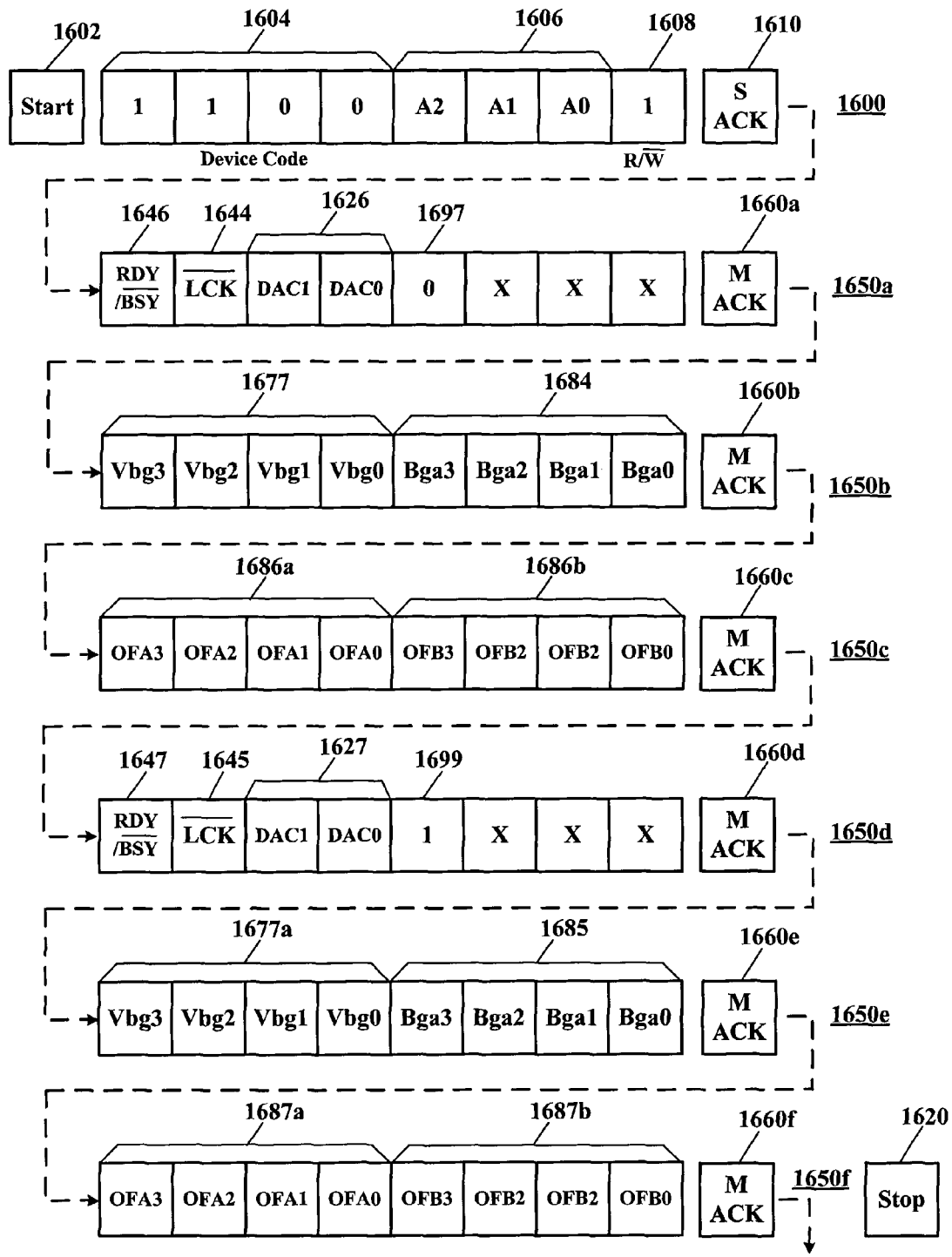
FIG. 16 illustrates a schematic byte diagram of an address, command and data protocol structures for reading in test mode the DAC input register and non-volatile memory of one or more DAC devices.

Referring to FIG. 16, depicted is a schematic byte diagram of an address, command and data protocol structure for reading in test mode the DAC input register and non-volatile memory of one or more DAC devices. A high voltage is applied to the load DAC output register input 122 (/LDAC) of device 200 (FIG. 2) before and during execution of the test mode read command. The test mode command of FIG. 16 begins with a start bit 1602 followed by a first byte 1600 sent by the bus master, e.g., a digital processor (not shown), wherein the first byte 1600 comprises a device code 1604 having four fixed identification bits (e.g., 1100*b*), three address bits 1606 (A2, A1, A0) used to select one of one of up to eight (8) devices, and a read/write bit 1608 (set to logic 1 indicating a read operation). Once the first byte 1600 of this read command in test mode from the bus master is finished, a slave acknowledge 1610 is asserted by the slave device (e.g., 100 or 200) under test.

Next a first slave byte 1650*a* is sent by the slave device. The first slave byte 1650*a* comprises the present status of the following data contained in the DAC register 106 of DAC channel A (FIG. 2): a ready/busy bit 1646 that indicates the completion status of a write to the non-volatile memory 114 (e.g., logic 1 indicates write complete, logic 0 indicates otherwise), a lock bit 1644, DAC channel selection bits 1626 (DAC1, DAC0), and a zero (0). After the first slave byte 1650*a* has been read by the bus master, the bus master sends a master acknowledge 1660*a*.

After the slave device receives the master acknowledge 1660*a*, a second slave byte 1650*b* is sent by the slave device. The second slave byte 1650*b* comprises the following data contained in the DAC register 106: Bandgap absolute value trim bits 1677 (Vbg3, Vbg2, Vbg1 and Vbg0), and Bandgap amplifier offset trim bits 1684 (Bba3, Bba2, Bba1 and Bba0). After the second slave byte 1650*b* has been read by the bus master, the bus master sends a master acknowledge 1660*b*.

After the slave device receives the master acknowledge 1660*b*, a third slave byte 1650*c* is sent by the slave device. The third slave byte 1650*c* comprises buffer amplifier A offset value trim bits 1686*a* and buffer amplifier B offset value trim bits 1686*b*. The fourth, fifth and sixth slave bytes 1650*d*, 1650*e* and 1650*f*, respectively, present the same types of data stored in the non-volatile memory 114 as read by the master in slave bytes 1650*a*, 1650*b* and 1650*c* above. After the sixth slave byte 1650*f* has been read by the bus master, the bus master sends a master acknowledge 1660*f*, and a stop bit 1620 is asserted on the serial bus 120.

Serial Interfaces

Figure 17:
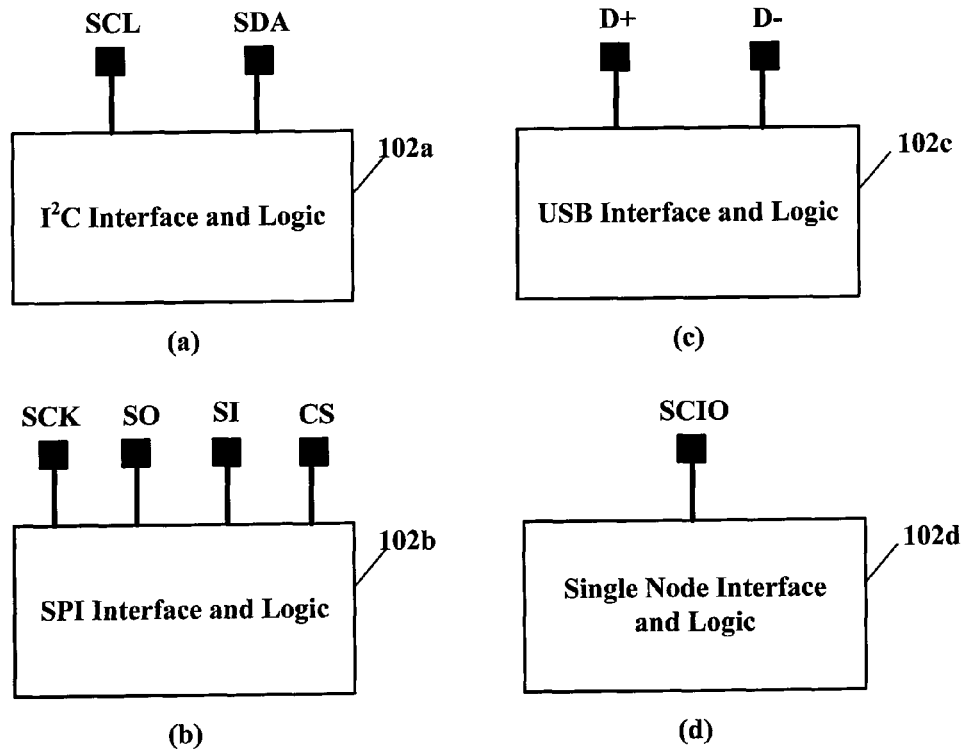
FIG. 17 illustrates schematic block and bus signal diagrams of various types of serial interfaces that may be used with the devices shown in FIGS. 1 and 2, according to specific example embodiments of this disclosure.

Referring to FIG. 17, depicted are schematic block and bus signal diagrams of various types of serial interfaces that may be used with the device shown in FIGS. 1 and 2, according to specific example embodiments of this disclosure.

As shown in FIG. 17(*a*), an I$^2$C interface and logic 102*a* has a serial clock line, SCL, and a serial data line, SDA. The I$^2$C interface specification is available from Phillips Semiconductors and is hereby incorporated herein for all purposes.

As shown in FIG. 17(*b*), a serial peripheral interface (SPI) and logic 102*b* has a serial clock, SCK, a data out line, SI, a data in line, SO, and a chip select, CS. The SPI interface specification is available from Motorola, Inc., or from any device manufacture incorporating the SPI interface in their products. The SPI interface specification is hereby incorporated herein for all purposes.

As shown in FIG. 17(*c*), a Universal Serial Bus (USB) and logic 102*c* has self clocking data lines D+ and D−. The USB interface specification is available at www.usb.org, or from any device manufacture incorporating the USB interface in their products. The USB interface specification is hereby incorporated herein for all purposes.

As shown in FIG. 17(*d*), a Serial Clock Input-Output (SCIO) and logic 102*d* has a single self clocking data line SCIO. The SCIO interface may use Manchester coding so that the clock and data are conveyed on a single bit line. Other serial interface standards are known to those skilled in digital electronics design and may also be effectively used with the teachings of this disclosure.

Figure 18:
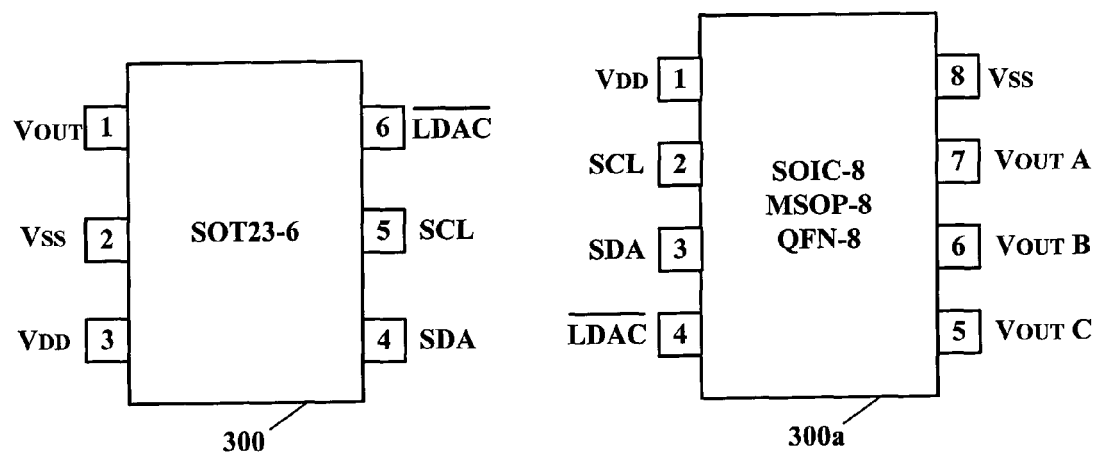
FIG. 18 illustrates schematic plan views of two of many integrated circuit packages that may be used with the devices shown in FIGS. 1 and 2, according to specific example embodiments of this disclosure.

Referring to FIG. 18, depicted are schematic plan views of two of many integrated circuit packages that may be used with the devices shown FIGS. 1 and 2, according to specific example embodiments of this disclosure. The I²C interface is shown, but it is contemplated and within the scope of this disclosure that any integrated circuit package may be used with any serial interface bus and number of analog outputs.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

The invention claimed is:

1. An integrated circuit device capable of digital-to-analog conversion and having registers and non-volatile memory for storage of device address, configuration information and digital values for conversion to analog values, said integrated circuit device comprising:
a serial input-output port adapted for coupling to a serial bus;
a serial interface and logic, the serial interface coupled to the serial input-output port;
one or more input registers coupled to the serial interface and logic;
one or more digital-to-analog converter registers coupled to respective ones of the one or more input registers;
one or more digital-to-analog converters coupled to respective ones of the one or more digital-to-analog converter registers; and
a non-volatile memory coupled to the one or more input registers, wherein the non-volatile memory stores address, configuration information and digital values for conversion to analog values;
wherein the serial input-output port receives commands that are coupled to the serial interface and logic, whereby the commands cause the serial interface and logic to control operation, reading and writing of data, and reading status of the integrated circuit device;
the commands are selected from the group consisting of:
a fast mode write command for writing configuration information and data to the one or more input registers,
a multiple write command for writing configuration information and data to the one or more input registers,
a sequential write command for writing configuration information and data to a plurality of DAC input registers and associated non-volatile memory locations,
a single write command for writing configuration information and data to a selected DAC input register and associated non-volatile memory locations,
a write new address command for writing a new address into the integrated circuit device,
a write voltage reference selection command for writing a voltage reference source selection for each of the DAC channels into the integrated circuit device,
a write power down selection command for writing a new write power down selection for each of the DAC channels into the integrated circuit device,
a write gain selection command for writing a new gain selection for each of the DAC channels into the integrated circuit device,
a read in normal mode command for reading status of the DAC channels and associated non-volatile memory,
a write lock bit command for writing a lock bit when the integrated circuit device is in a test mode,
a write contents of DAC input registers to non-volatile memory command for writing the contents of the DAC input registers to non-volatile memory when the integrated circuit device is in a test mode,
a write bandgap voltage reference trim bits command for writing the bandgap voltage reference trim bits to the DAC input registers when the integrated circuit device is in a test mode,
a write buffer offset trim bits to DAC input registers command for writing the buffer offset trim bits to the DAC input registers when the integrated circuit device is in a test mode, and
a read in test mode command for reading status of the DAC channels and associated non-volatile memory.

2. The integrated circuit device according to claim 1, further comprising a charge pump for supplying a write voltage to the at least one non-volatile memory during a write operation.

3. The integrated circuit device according to claim 1, further comprising power down control logic for controlling the one or more digital-to-analog converters.

4. The integrated circuit device according to claim 1, further comprising one or more analog amplifiers coupled to an analog output of respective ones of the one or more digital-to-analog converters.

5. The integrated circuit device according to claim 4, further comprising power down control logic for controlling the one or more analog amplifiers.

6. The integrated circuit device according to claim 1, further comprising a power-on-reset circuit for resetting the integrated circuit device upon loss of power thereto.

7. The integrated circuit device according to claim 1, further comprising an input for transferring data from the one or more input registers to the one or more digital-to-analog converter registers.

8. The integrated circuit device according to claim 1, wherein each of the one or more digital-to-analog converters has 12 bits resolution.

9. The integrated circuit device according to claim 1, wherein the non-volatile memory is electrically erasable and programmable read only memory (EEPROM).

10. The integrated circuit device according to claim 1, wherein the non-volatile memory is FLASH memory.

11. The integrated circuit device according to claim 1, wherein the fast write command comprises:
a first byte consisting of
a device code,
a device address for selection of the integrated circuit device, and
a read/write selection code indicating a write operation to the integrated circuit device;
a second byte consisting of
a command code representing a fast mode write command to the integrated circuit device,
a first power down selection code for a first digital-to-analog (DAC) channel of the integrated circuit device, and four most significant bits of data for the first DAC channel;
a third byte consisting of
eight least significant bits of data for the first DAC channel;
a fourth byte consisting of
a second power down selection code for a second DAC channel, and
four most significant bits of data for the second DAC channel; and
a fifth byte consisting of
eight least significant bits of data for the second DAC channel;
wherein a slave acknowledge bit is sent by the addressed integrated circuit device bus slave after each of the first through fifth bytes are sent by a bus master; and
the bus master sends a stop bit when the fast mode write command is finished.

12. The integrated circuit device according to claim 11, further comprising:
a sixth byte consisting of
a third power down selection code for a third DAC channel, and
four most significant bits of data for the third DAC channel; and
a seventh byte consisting of
eight least significant bits of data for the third DAC channel;
wherein the slave acknowledge bit is sent by the addressed integrated circuit device bus slave after each of the first through seventh bytes are sent by the bus master; and
the bus master sends the stop bit when the fast mode write command is finished.

13. The integrated circuit device according to claim 12, further comprising:
an eighth byte consisting of
a fourth power down selection code for a fourth DAC channel, and
four most significant bits of data for the fourth DAC channel; and
a ninth byte consisting of
eight least significant bits of data for the fourth DAC channel;
wherein the slave acknowledge bit is sent by the addressed integrated circuit device bus slave after each of the first through ninth bytes are sent by the bus master; and
the bus master sends the stop bit when the fast mode write command is finished.

14. The integrated circuit device according to claim 1, wherein the multiple write command comprises:
a first byte consisting of
a device code,
a device address for selection of the integrated circuit device, and
a read/write selection code indicating a write operation to the integrated circuit device;
a second byte consisting of
a command code representing a multiple write command to the integrated circuit device,
a multiple write function code,
a selection code for a first DAC channel, and
a first update output register bit representing whether a first DAC output register of the first DAC channel is updated or not;
a third byte consisting of
a first voltage reference selection bit,
a first power down selection code for the first DAC channel,
a gain selection bit for the first DAC channel, and
four most significant bits of data for the first DAC channel;
a fourth byte consisting of
eight least significant bits of data for the first DAC channel;
a fifth byte consisting of
a selection code for a second DAC channel, and
a second update output register bit representing whether a second DAC output register of the second DAC channel is updated or not;
a sixth byte consisting of
a second voltage reference selection bit,
a second power down selection code for the second DAC channel,
a gain selection bit for the second DAC channel, and
four most significant bits of data for the second DAC channel; and
a seventh byte consisting of
eight least significant bits of data for the second DAC channel;
wherein a slave acknowledge bit is sent by the addressed integrated circuit device bus slave after each of the first through seventh bytes are sent by a bus master; and
the bus master sends a stop bit when the multiple write command is finished.

15. The integrated circuit device according to claim 14, further comprising:
an eighth byte consisting of
a selection code for a third DAC channel, and
a third update output register bit representing whether a third DAC output register of the third DAC channel is updated or not;
a ninth byte consisting of
a third voltage reference selection bit,
a third power down selection code for the third DAC channel,
a gain selection bit for the third DAC channel, and
four most significant bits of data for the third DAC channel; and
a tenth byte consisting of
eight least significant bits of data for the third DAC channel;
wherein a slave acknowledge bit is sent by the addressed integrated circuit device bus slave after each of the first through tenth bytes are sent by a bus master; and
the bus master sends a stop bit when the multiple write command is finished.

16. The integrated circuit device according to claim 14, further comprising:
an eleventh byte consisting of
a selection code for a fourth DAC channel, and
a fourth update output register bit representing whether a fourth DAC output register of the fourth DAC channel is updated or not;
a twelfth byte consisting of
a fourth voltage reference selection bit,
a fourth power down selection code for the fourth DAC channel,
a gain selection bit for the fourth DAC channel, and
four most significant bits of data for the fourth DAC channel; and
a thirteenth byte consisting of
eight least significant bits of data for the fourth DAC channel;

wherein a slave acknowledge bit is sent by the addressed integrated circuit device bus slave after each of the first through thirteenth bytes are sent by a bus master; and the bus master sends a stop bit when the multiple write command is finished.

17. The integrated circuit device according to claim 1, wherein the sequential write command comprises:
a first byte consisting of
a device code,
a device address for selection of the integrated circuit device, and
a read/write selection code indicating a write operation to the integrated circuit device;
a second byte consisting of
a command code representing a sequential write command to the integrated circuit device,
a sequential write function code,
a selection code for a starting DAC channel of the sequential write command, and
an update output register bit representing whether DAC output registers of all DAC channels being written to are updated or not;
a third byte consisting of
a voltage reference selection bit for the DAC channel being written to,
a power down selection code for the DAC channel being written to,
a gain selection bit for the DAC channel being written to, and
four most significant bits of data for the DAC channel being written to;
a fourth byte consisting of
eight least significant bits of data for the DAC channel being written to;
bytes three and four are repeated for each DAC channel being written to; and
the non-volatile memory is updated with the configuration information and data sent to each of the DAC channels written to;
wherein a slave acknowledge bit is sent by the addressed integrated circuit device bus slave after each of the bytes are sent by a bus master; and
the bus master sends a stop bit when the sequential write command is finished.

18. The integrated circuit device according to claim 1, wherein the single write command comprises:
a first byte consisting of
a device code,
a device address for selection of the integrated circuit device, and
a read/write selection code indicating a write operation to the integrated circuit device;
a second byte consisting of
a command code representing a single write command to the integrated circuit device,
a single write function code,
a selection code for a DAC channel, and
an update output register bit representing whether a DAC output register of the selected DAC channel being written to is updated or not;
a third byte consisting of
a voltage reference selection bit for the selected DAC channel being written to,
a power down selection code for the selected DAC channel being written to,
a gain selection bit for the selected DAC channel being written to, and
four most significant bits of data for the selected DAC channel being written to; and
a fourth byte consisting of
eight least significant bits of data for the selected DAC channel being written to; and
the non-volatile memory is updated with the configuration information and data sent to the selected DAC channels written to;
wherein a slave acknowledge is sent by the addressed integrated circuit device bus slave after each of the bytes are sent by a bus master; and
the bus master sends a stop bit when the sequential write command is finished.

19. The integrated circuit device according to claim 1, wherein the write new address command comprises:
a first byte consisting of
a device code,
a device address for selection of the integrated circuit device, and
a read/write selection code indicating a write operation to the integrated circuit device;
a second byte consisting of
a command code representing a write new address command to the integrated circuit device,
a current device address; and
a first bit pattern;
changing a logic level on an input for loading a DAC output register and retaining this logic level until a third byte is finished;
the third byte consisting of
the command code,
a new device address; and
a second bit pattern;
a fourth byte consisting of
the command code,
the new device address; and
wherein a slave acknowledge bit is sent by the addressed integrated circuit device bus slave after each of the bytes are sent by a bus master; and
the bus master sends a stop bit when the write new address command is finished.

20. The integrated circuit device according to claim 1, wherein the write voltage reference selection command comprises:
a first byte consisting of
a device code,
a device address for selection of the integrated circuit device, and
a read/write selection code indicating a write operation to the integrated circuit device; and
a second byte consisting of
a command code representing a write voltage reference selection command, and
status bits for updating a selection of voltage references for the DAC channels;
wherein a slave acknowledge bit is sent by the addressed integrated circuit device bus slave after each of the bytes are sent by a bus master; and
the bus master sends a stop bit when the write voltage reference selection command is finished.

21. The integrated circuit device according to claim 1, wherein the write power down selection command comprises:
a first byte consisting of
a device code,
a device address for selection of the integrated circuit device, and a read/write selection code indicating a write operation to the integrated circuit device; and a second byte consisting of
a command code representing a write power down selection command, and
status bits of a first two of the voltage references used by the DAC channels; and a third byte consisting of
status bits of a next two of the voltage references used by the DAC channels;

wherein a slave acknowledge bit is sent by the addressed integrated circuit device bus slave after each of the bytes are sent by a bus master; and the bus master sends a stop bit when the write power down selection command is finished.

22. The integrated circuit device according to claim 1, wherein the write gain selection command comprises:

a first byte consisting of
a device code,
a device address for selection of the integrated circuit device, and
a read/write selection code indicating a write operation to the integrated circuit device; and a second byte consisting of
a command code representing a write gain selection command, and
status bits for updating a selection of amplifier gains for the DAC channels;

wherein a slave acknowledge bit is sent by the addressed integrated circuit device bus slave after each of the bytes are sent by a bus master; and the bus master sends a stop bit when the write gain selection command is finished.

23. The integrated circuit device according to claim 1, wherein the read in normal mode command comprises:

a first byte consisting of
a device code,
a device address for selection of the integrated circuit device, and
a read/write selection code indicating a read operation from the integrated circuit device;

a second byte consisting of
ready/busy status indicating completion status of a write to the non-volatile memory,
power-on-reset status,
a selection code for a first DAC channel,
a bit at logic zero, and
the device address;

a third byte consisting of
a voltage reference selection status for the selected first DAC channel being read,
a power down selection code status for the selected first DAC channel being read,
a gain selection status for the selected first DAC channel being read,
four most significant bits of data from the selected first DAC channel being read;

a fourth byte consisting of
eight least significant bits of data from the selected first DAC channel being read;

a fifth byte consisting of
ready/busy status indicating completion status of the write to the non-volatile memory,
power-on-reset status from the non-volatile memory associated with the selected first DAC channel being read,
a selection code for the first DAC channel being read,
a bit at logic zero, and
the device address;

a sixth byte consisting of
a voltage reference selection status from the non-volatile memory associated with the selected first DAC channel being read,
a power down selection code status from the non-volatile memory associated with the selected first DAC channel being read,
a gain selection status for the selected first DAC channel being read, and
four most significant bits of data from the non-volatile memory associated with the selected first DAC channel being read; and a seventh byte consisting of
eight least significant bits of data from the non-volatile memory associated with the selected first DAC channel being read;

wherein a slave acknowledge is sent by the addressed integrated circuit device bus slave after the first byte is sent by a bus master,
wherein a master acknowledge is sent by the bus master after each of the second through seventh bytes are send by the bus master, and thereafter the bus master sends a stop bit when the read in normal mode command is finished.

24. The integrated circuit device according to claim 23, further comprising:

an eighth byte consisting of
the ready/busy status indicating completion status of a write to the non-volatile memory,
the power-on-reset status,
a selection code for a second DAC channel,
a bit at logic zero, and
the device address;

a ninth byte consisting of
a voltage reference selection status for the selected second DAC channel being read,
a power down selection code status for the selected second DAC channel being read,
a gain selection status for the selected second DAC channel being read,
four most significant bits of data from the selected second DAC channel being read;

a tenth byte consisting of
eight least significant bits of data from the selected second DAC channel being read;

an eleventh byte consisting of
the ready/busy status indicating completion status of the write to the non-volatile memory,
power-on-reset status from the non-volatile memory associated with the selected second DAC channel being read,
a selection code for the second DAC channel being read,
a bit at logic zero, and
the device address;

a twelfth byte consisting of
a voltage reference selection status from the non-volatile memory associated with the selected second DAC channel being read,
a power down selection code status from the non-volatile memory associated with the selected second DAC channel being read,
a gain selection status for the selected second DAC channel being read, and four most significant bits of data from the non-volatile memory associated with the selected second DAC channel being read; and
a thirteenth byte consisting of
eight least significant bits of data from the non-volatile memory associated with the selected second DAC channel being read;
wherein the slave acknowledge is sent by the addressed integrated circuit device bus slave after the first byte is sent by the bus master,
wherein the master acknowledge is sent by the bus master after each of the second through thirteenth bytes are send by the bus master, and thereafter the bus master sends the stop bit after the seventh and tenth bytes, and after the thirteenth byte when the read in normal mode command is finished.

25. The integrated circuit device according to claim 24, further comprising:
a fourteenth byte consisting of
the ready/busy status indicating completion status of a write to the non-volatile memory,
the power-on-reset status,
a selection code for a third DAC channel,
a bit at logic zero, and
the device address;
a fifteenth byte consisting of
a voltage reference selection status for the selected third DAC channel being read,
a power down selection code status for the selected third DAC channel being read,
a gain selection status for the selected third DAC channel being read,
four most significant bits of data from the selected third DAC channel being read;
a sixteenth byte consisting of
eight least significant bits of data from the selected third DAC channel being read;
a seventeenth byte consisting of
the ready/busy status indicating completion status of the write to the non-volatile memory,
power-on-reset status from the non-volatile memory associated with the selected third DAC channel being read,
a selection code for the third DAC channel being read,
a bit at logic zero, and
the device address;
an eighteenth byte consisting of
a voltage reference selection status from the non-volatile memory associated with the selected third DAC channel being read,
a power down selection code status from the non-volatile memory associated with the selected third DAC channel being read,
a gain selection status for the selected third DAC channel being read, and
four most significant bits of data from the non-volatile memory associated with the selected third DAC channel being read; and
a nineteenth byte consisting of
eight least significant bits of data from the non-volatile memory associated with the selected third DAC channel being read;
wherein the slave acknowledge is sent by the addressed integrated circuit device bus slave after the first byte is sent by the bus master,
wherein a master acknowledge is sent by the bus master after each of the second through nineteenth bytes are send by the bus master, and thereafter the bus master sends the stop bit after the seventh, tenth and sixteenth bytes, and after the nineteenth byte when the read in normal mode command is finished.

26. The integrated circuit device according to claim 25, further comprising:
a twentieth byte consisting of
the ready/busy status indicating completion status of a write to the non-volatile memory,
the power-on-reset status,
a selection code for a fourth DAC channel,
a bit at logic zero, and
the device address;
a twenty-first byte consisting of
a voltage reference selection status for the selected fourth DAC channel being read,
a power down selection code status for the selected fourth DAC channel being read,
a gain selection status for the selected fourth DAC channel being read,
four most significant bits of data from the selected fourth DAC channel being read;
a twenty-second byte consisting of
eight least significant bits of data from the selected fourth DAC channel being read;
a twenty-third byte consisting of
the ready/busy status indicating completion status of the write to the non-volatile memory,
power-on-reset status from the non-volatile memory associated with the selected fourth DAC channel being read,
a selection code for the fourth DAC channel being read,
a bit at logic zero, and
the device address;
a twenty-fourth byte consisting of
a voltage reference selection status from the non-volatile memory associated with the selected fourth DAC channel being read,
a power down selection code status from the non-volatile memory associated with the selected fourth DAC channel being read,
a gain selection status for the selected fourth DAC channel being read, and
four most significant bits of data from the non-volatile memory associated with the selected fourth DAC channel being read; and
a twenty-fifth byte consisting of
eight least significant bits of data from the non-volatile memory associated with the selected fourth DAC channel being read;
wherein the slave acknowledge is sent by the addressed integrated circuit device bus slave after the first byte is sent by the bus master,
wherein a master acknowledge is sent by the bus master after each of the second through twenty-fifth bytes are send by the bus master, and thereafter the bus master sends the stop bit after the seventh, tenth, sixteenth and twenty-second bytes, and after the twenty-fifth byte when the read in normal mode command is finished.

27. The integrated circuit device according to claim 1, wherein the write lock bit command comprises:
a first byte consisting of
a device code, and
a read/write selection code indicating a write operation to the integrated circuit device; and a second byte consisting of
a command code representing the write lock bit command, and
a lock bit status bit;
wherein a slave acknowledge bit is sent by the addressed integrated circuit device bus slave after each of the bytes are sent by a bus master; and
the bus master sends a stop bit when the write lock bit command is finished.

28. The integrated circuit device according to claim 1, wherein the write contents of DAC input registers to non-volatile memory command comprises:
a first byte consisting of
a device code, and
a read/write selection code indicating a write operation to the integrated circuit device; and
a second byte consisting of
a command code representing the write contents of DAC input registers to non-volatile memory command, and
an enable bit;
wherein a slave acknowledge bit is sent by the addressed integrated circuit device bus slave after each of the bytes are sent by a bus master; and
the bus master sends a stop bit when the write contents of DAC input registers to non-volatile memory command is finished.

29. The integrated circuit device according to claim 1, wherein the write bandgap voltage reference trim bits command comprises:
a first byte consisting of
a device code, and
a read/write selection code indicating a write operation to the integrated circuit device;
a second byte consisting of
a command code representing the write bandgap voltage reference trim bits command, and
a voltage reference selection bit; and
a third byte consisting of
bandgap absolute value trim bits, and
bandgap amplifier offset trim bits;
wherein a slave acknowledge bit is sent by the addressed integrated circuit device bus slave after each of the bytes are sent by a bus master; and
the bus master sends a stop bit when the write bandgap voltage reference trim bits command is finished.

30. The integrated circuit device according to claim 1, wherein the write buffer offset trim bits to DAC input registers command comprises:
a first byte consisting of
a device code, and
a read/write selection code indicating a write operation to the integrated circuit device;
a second byte consisting of
a command code representing the write buffer offset trim bits to DAC input registers command,
a selection code for a DAC channel, and
a selection bit for using either a first or a second buffer amplifier; and
a third byte consisting of
offset value trim bits for the first buffer amplifier, and
offset value trim bits for the second buffer amplifier;
wherein a slave acknowledge bit is sent by the addressed integrated circuit device bus slave after each of the bytes are sent by a bus master; and
the bus master sends a stop bit when the write buffer offset trim bits to DAC input registers command is finished.

31. The integrated circuit device according to claim 1, wherein the read in test mode command comprises:
a first byte consisting of
a device code,
a device address for selection of the integrated circuit device, and
a read/write selection code indicating a read operation from the integrated circuit device;
a second byte consisting of
ready/busy status indicating completion status of a write to the non-volatile memory,
lock bit status,
a selection code for a first DAC channel, and
a bit at logic zero,
a third byte consisting of
bandgap absolute value trim bit status in registers associated with the first DAC channel, and
bandgap amplifier offset trim bit status in the registers associated with the first DAC channel;
a fourth byte consisting of
a first buffer amplifier offset value trim bit status in registers associated with the first DAC channel, and
a second buffer amplifier offset value trim bit status in registers associated with the first DAC channel;
a fifth byte consisting of
ready/busy status indicating completion status of a write to the non-volatile memory,
the lock bit status,
a selection code for the first DAC channel, and
a bit at logic one,
a sixth byte consisting of
bandgap absolute value trim bit status in non-volatile memory associated with the first DAC channel, and
bandgap amplifier offset trim bit status in the non-volatile memory associated with the first DAC channel; and
a seventh byte consisting of
a first buffer amplifier offset value trim bit status in the non-volatile memory associated with the first DAC channel, and
a second buffer amplifier offset value trim bit status in the non-volatile memory associated with the first DAC channel;
wherein a slave acknowledge is sent by the addressed integrated circuit device bus slave after the first byte is sent by a bus master,
wherein a master acknowledge is sent by the bus master after each of the second through seventh bytes are send by the bus master, and thereafter t the bus master sends a stop bit when the read in test mode command is finished.

32. The integrated circuit device according to claim 31, further comprising:
an eighth byte consisting of
the ready/busy status indicating completion status of a write to the non-volatile memory,
the lock bit status,
a selection code for a second DAC channel, and
a bit at logic zero,
a ninth byte consisting of
bandgap absolute value trim bit status in registers associated with the second DAC channel, and
bandgap amplifier offset trim bit status in the registers associated with the second DAC channel;

a tenth byte consisting of
  a first buffer amplifier offset value trim bit status in registers associated with the second DAC channel, and
  a second buffer amplifier offset value trim bit status in registers associated with the second DAC channel;
an eleventh byte consisting of
  ready/busy status indicating completion status of a write to the non-volatile memory,
  the lock bit status,
  a selection code for the second DAC channel, and
  a bit at logic one,
a twelfth byte consisting of
  bandgap absolute value trim bit status in non-volatile memory associated with the second DAC channel, and
  bandgap amplifier offset trim bit status in the non-volatile memory associated with the second DAC channel; and
a thirteenth byte consisting of
  a first buffer amplifier offset value trim bit status in the non-volatile memory associated with the second DAC channel, and
  a second buffer amplifier offset value trim bit status in the non-volatile memory associated with the second DAC channel;
wherein a slave acknowledge is sent by the addressed integrated circuit device bus slave after the first byte is sent by a bus master,
wherein a master acknowledge is sent by the bus master after each of the second through thirteenth bytes are send by the bus master, the bus master sends a stop bit after the seventh byte, and the thirteenth byte when the read in test mode command is finished.

33. The integrated circuit device according to claim 32, further comprising:
a fourteenth byte consisting of
  the ready/busy status indicating completion status of a write to the non-volatile memory,
  the lock bit status,
  a selection code for a third DAC channel, and
  a bit at logic zero,
a fifteenth byte consisting of
  bandgap absolute value trim bit status in registers associated with the third DAC channel, and
  bandgap amplifier offset trim bit status in the registers associated with the third DAC channel;
a sixteenth byte consisting of
  a first buffer amplifier offset value trim bit status in registers associated with the third DAC channel, and
  a second buffer amplifier offset value trim bit status in registers associated with the third DAC channel;
a seventeenth byte consisting of
  ready/busy status indicating completion status of a write to the non-volatile memory,
  the lock bit status,
  a selection code for the third DAC channel, and
  a bit at logic one,
an eighteenth byte consisting of
  bandgap absolute value trim bit status in non-volatile memory associated with the third DAC channel, and
  bandgap amplifier offset trim bit status in the non-volatile memory associated with the third DAC channel; and
a nineteenth byte consisting of
  a first buffer amplifier offset value trim bit status in the non-volatile memory associated with the third DAC channel, and
  a second buffer amplifier offset value trim bit status in the non-volatile memory associated with the third DAC channel;
wherein a slave acknowledge is sent by the addressed integrated circuit device bus slave after the first byte is sent by a bus master,
wherein a master acknowledge is sent by the bus master after each of the second through nineteenth bytes are send by the bus master, the bus master sends a stop bit after the seventh and thirteenth bytes, and the nineteenth byte when the read in test mode command is finished.

34. The integrated circuit device according to claim 33, further comprising:
a twentieth byte consisting of
  the ready/busy status indicating completion status of a write to the non-volatile memory,
  the lock bit status,
  a selection code for a fourth DAC channel, and
  a bit at logic zero,
a twenty-first byte consisting of
  bandgap absolute value trim bit status in registers associated with the fourth DAC channel, and
  bandgap amplifier offset trim bit status in the registers associated with the fourth DAC channel;
a twenty-second byte consisting of
  a first buffer amplifier offset value trim bit status in registers associated with the fourth DAC channel, and
  a second buffer amplifier offset value trim bit status in registers associated with the fourth DAC channel;
a twenty-third byte consisting of
  ready/busy status indicating completion status of a write to the non-volatile memory,
  the lock bit status,
  a selection code for the fourth DAC channel, and
  a bit at logic one,
a twenty-fourth byte consisting of
  bandgap absolute value trim bit status in non-volatile memory associated with the fourth DAC channel, and
  bandgap amplifier offset trim bit status in the non-volatile memory associated with the fourth DAC channel; and
a twenty-fifth byte consisting of
  a first buffer amplifier offset value trim bit status in the non-volatile memory associated with the fourth DAC channel, and
  a second buffer amplifier offset value trim bit status in the non-volatile memory associated with the fourth DAC channel;
wherein a slave acknowledge is sent by the addressed integrated circuit device bus slave after the first byte is sent by a bus master,
wherein a master acknowledge is sent by the bus master after each of the second through twenty-fifth bytes are send by the bus master, the bus master sends a stop bit after the seventh, thirteenth and nineteenth bytes, and the twenty-fifth byte when the read in test mode command is finished.

* * * * *